(12) United States Patent
Lee et al.

(10) Patent No.: US 9,259,910 B2
(45) Date of Patent: Feb. 16, 2016

(54) SUBSTRATE SEPARATION APPARATUS AND METHOD

(71) Applicant: Samsung Display Co. Ltd., Yongin, Gyeonggi-Do (KR)

(72) Inventors: Seung Jun Lee, Yongin-si (KR); Joon Hyung Kim, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/248,983

(22) Filed: Apr. 9, 2014

(65) Prior Publication Data

US 2014/0352892 A1    Dec. 4, 2014

(30) Foreign Application Priority Data

May 31, 2013  (KR) .......................... 10-2013-0062721

(51) Int. Cl.
*B32B 38/10*   (2006.01)
*B32B 43/00*   (2006.01)
*B32B 37/00*   (2006.01)
*B32B 38/18*   (2006.01)

(52) U.S. Cl.
CPC ........... *B32B 43/006* (2013.01); *B32B 37/0046* (2013.01); *B32B 38/10* (2013.01); *B32B 38/1858* (2013.01); *B32B 2310/0881* (2013.01); *B32B 2457/08* (2013.01); *B32B 2457/20* (2013.01); *H01L 2221/683* (2013.01); *Y10T 156/11* (2015.01); *Y10T 156/1132* (2015.01); *Y10T 156/1168* (2015.01); *Y10T 156/1184* (2015.01); *Y10T 156/19* (2015.01); *Y10T 156/1944* (2015.01); *Y10T 156/1967* (2015.01)

(58) Field of Classification Search
CPC .... B32B 43/00; B32B 43/003; B32B 43/006; B32B 38/10; Y10T 156/1961; Y10T 156/1978; Y10T 156/1168; Y10T 156/11; Y10T 156/1132; Y10T 156/1184; Y10T 156/19; Y10T 156/1944; Y10T 156/1967; H01L 2221/683
USPC .......... 156/707, 717, 758, 761, 762, 701, 750
See application file for complete search history.

(56) References Cited

U.S. PATENT DOCUMENTS 4,798,645 A * 1/1989 Pak ................................ 156/716
5,399,228 A * 3/1995 Schroeder et al. ............ 156/542

(Continued)

FOREIGN PATENT DOCUMENTS

KR  10-2008-0089730 A  10/2008
KR  10-2012-0055997 A   6/2012
KR  10-2012-0062193 A   6/2012

*Primary Examiner* — Mark A Osele
*Assistant Examiner* — Nickolas Harm
(74) *Attorney, Agent, or Firm* — Innovation Counsel LLP

(57) ABSTRACT

Provided are a substrate separation apparatus and method. The substrate separation apparatus includes: an upper transfer part which fixes the upper substrate and transfers the upper substrate in a positive X-axis direction in an XY coordinate system composed of an X axis and a Y axis intersecting each other; and a lower transfer part which is installed under the upper transfer part with a gap therebetween and fixes and transfers the lower substrate, wherein the lower transfer part includes: a lower holding unit on which the lower substrate is placed; and a lower guide unit which includes path guides for guiding movement of the lower holding unit, wherein the path guides include a first path guide which is parallel to the X axis and a second path guide which is continuous with the first path guide and contacts a straight line having a negative slope in the XY coordinate system.

20 Claims, 23 Drawing Sheets

(56) References Cited

U.S. PATENT DOCUMENTS

| | | | |
|---|---|---|---|
| 5,482,899 A * | 1/1996 | McKenna et al. | 156/716 |
| 5,589,029 A * | 12/1996 | Matsui et al. | 156/765 |
| 5,911,850 A * | 6/1999 | Zung | 156/765 |
| 6,039,833 A * | 3/2000 | Freund et al. | 156/765 |
| 6,932,136 B1 * | 8/2005 | Kelkar et al. | 156/750 |
| 7,374,630 B2 * | 5/2008 | Nakamura | 156/247 |
| 8,261,804 B1 * | 9/2012 | Huang | 156/762 |
| 2002/0195199 A1 * | 12/2002 | Izutani et al. | 156/344 |
| 2009/0025875 A1 * | 1/2009 | Hagman | 156/344 |
| 2011/0253316 A1 * | 10/2011 | Kost | 156/761 |
| 2012/0145332 A1 * | 6/2012 | Chien et al. | 156/758 |
| 2013/0048224 A1 * | 2/2013 | George et al. | 156/752 |

* cited by examiner

SUBSTRATE SEPARATION APPARATUS AND METHOD

This application claims priority from Korean Patent Application No. 10-2013-0062721 filed on May 31, 2013 in the Korean Intellectual Property Office, the disclosure of which is incorporated herein by reference in its entirety.

BACKGROUND OF THE INVENTION

1. Field of the Invention

The present invention relates to a substrate separation apparatus and method.

2. Description of the Related Art

Recently, the importance of electronic devices having flexibility has been increasing. Accordingly, various technologies for implementing organic light-emitting displays (OLED), electrophoretic displays (EPD), plasma display panels (PDP), thin-film transistors (TFT), microprocessors, random access memory (RAM), etc. on a flexible substrate are required.

To manufacture an electronic device on a flexible substrate, a method of attaching a flexible substrate onto a carrier substrate that is made of a hard material, and then forming the electronic device has been suggested. In this method, the process of separating the carrier substrate and the flexible substrate is essential.

However, the electronic device can be damaged or cracked in the process of separating the carrier substrate and the flexible substrate, the carrier substrate and the flexible substrate may not be smoothly separated due to static electricity generated in the separation process, and contamination may occur when foreign substances adhere to the carrier substrate and the flexible substrate due to static electricity.

SUMMARY OF THE INVENTION

A substrate separation apparatus and method which can stably separate an upper substrate and a flexible lower substrate are provided.

A substrate separation apparatus and method which can minimize contamination by controlling static electricity in a substrate separation process are also provided.

However, aspects of the present invention are not restricted to the one set forth herein. The above and other aspects will become more apparent to one of ordinary skill in the relevant art by referencing the detailed description given below.

According to an aspect, there is provided an apparatus for separating an upper substrate and a lower substrate which are in contact with each other. The apparatus includes: an upper transfer part which fixes the upper substrate and transfers the upper substrate in a positive X-axis direction in an XY coordinate system that includes an X axis and a Y axis intersecting each other; and a lower transfer part which is installed under the upper transfer part with a gap therebetween and fixes and transfers the lower substrate, wherein the lower transfer part includes: a lower holding unit on which the lower substrate is placed; and a lower guide unit which includes path guides for guiding the movement of the lower holding unit, wherein the path guides includes: a first path guide which is parallel to the X axis and a second path guide which is continuous with the first path guide and is formed along a line having a negative slope in the XY coordinate system. The absolute value of the slope of the line may be constant. The absolute value of the slope of the line may increase as a distance from the first path guide increases.

According to another aspect, there is provided an apparatus for separating an upper substrate and a lower substrate which are in contact with each other. The apparatus includes: an upper transfer part which fixes a top surface of the upper substrate and transfers the upper substrate along a straight line; and a lower transfer part which is installed under the upper transfer part, fixes a bottom surface of the lower substrate, and transfers the lower substrate, wherein the lower transfer part includes: a lower holding unit on which the lower substrate is placed; and a lower guide unit which includes path guides for guiding the movement of the lower holding unit, wherein the path guides include: a first path guide whose vertical distance from the straight line is constant; and a second path guide which is continuous with the first path guide and whose vertical distance from the straight line increases as a distance from the first path guide increases.

According to another aspect, there is provided a method of separating an upper substrate and a lower substrate which are in contact with each other. The method includes: fixing a bottom surface of the lower substrate and a top surface of the upper substrate; transferring the upper substrate along a straight line; and transferring the lower substrate at the same time as the transferring of the upper substrate, wherein the transferring of the lower substrate includes: moving a lower holding unit on which the lower substrate is placed along a first path guide whose vertical distance from the straight line remains unchanged; and separating the lower substrate and the upper substrate by moving the lower holding unit along a second path guide which is continuous with the first path guide and whose vertical distance from the straight line increases as a distance from the first path guide increases.

BRIEF DESCRIPTION OF THE DRAWINGS

The above and other aspects and features will become more apparent by describing in detail example embodiments thereof with reference to the attached drawings, in which.

DETAILED DESCRIPTION OF THE INVENTION

Figure 1:
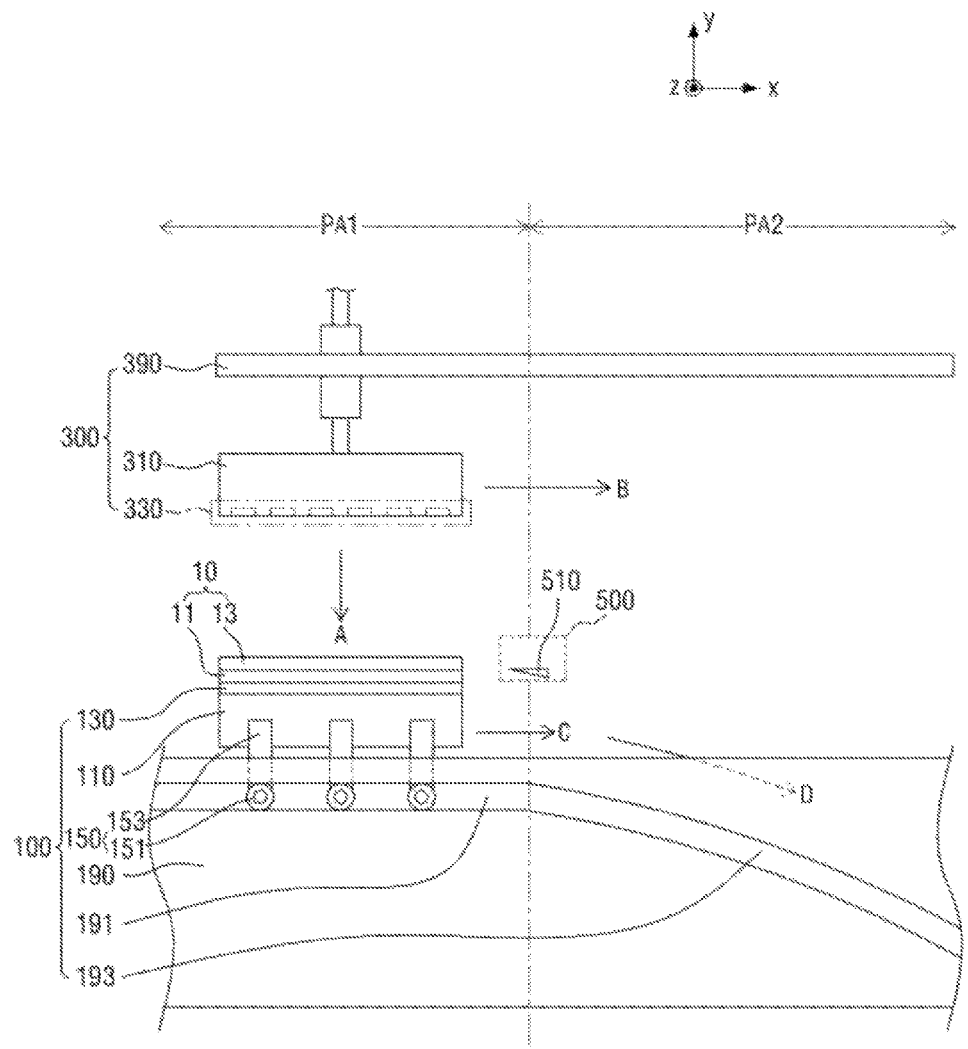
FIG. 1 is a schematic cross-sectional view of a substrate separation apparatus according to an embodiment.

Advantages and features of the present disclosure and methods of accomplishing the same may be understood more readily by reference to the following detailed description of example embodiments and the accompanying drawings. The present invention may however, be embodied in many different forms and should not be construed as being limited to the embodiments set forth herein. Like numbers refer to like elements throughout. In the drawings, sizes and relative sizes of layers and regions may be exaggerated for clarity.

It will be understood that when an element or layer is referred to as being "on" another element or layer, it can be directly on the other element or layer, or intervening elements or layers may be present.

It will be understood that, although the terms first, second, third, etc., may be used herein to describe various elements, these elements should not be limited by these terms. These terms are only used to distinguish one element from another element. Thus, a first element discussed below could be termed a second element without departing from the teachings of the present disclosure.

Hereinafter, example embodiments will be described with reference to the attached drawings.

FIG. 1 is a schematic cross-sectional view of a substrate separation apparatus according to an example embodiment.

Referring to FIG. 1, the substrate separation apparatus according to the present disclosure is configured to separate a stacked structure 10 of a lower substrate 11 and an upper substrate 13, which are in contact with each other, into a separated lower substrate 11 and upper substrate 13.

The lower substrate 11 of the stacked structure 10 may be flexible and may come in any form as long as it is flexible. For example, the lower substrate 11 may be a film or a sheet or may be a flexible printed circuit board (FPCB). In addition, the lower substrate 11 may include an electronic device having flexibility. The electronic device may be, for example, one or more displays selected from the group consisting of an organic light-emitting display (OLED), a liquid crystal display (LCD), and a white organic light-emitting diode (WOLED) display. The lower substrate 11 may also include a flexible insulating substrate (e.g., a polyimide substrate) and the electronic device mounted on the flexible insulating substrate. However, these are merely examples, and all flexible objects that have been developed and commercialized or are realizable depending on future technological developments can be used as the lower substrate 11 of the present invention.

The upper substrate 13 may be flexible or rigid. For example, the upper substrate 13 may be a film or a sheet or may be an electronic device including the film or the sheet. In addition, the upper substrate 13 may be a rigid carrier substrate or a window of a display. If rigid, the upper substrate 13 may be, but is not limited to, any one of a glass substrate, a quartz substrate, a sapphire substrate, and a ceramic substrate.

The substrate separation apparatus may include a lower transfer part 100 and an upper transfer part 300 which is disposed on the lower transfer part 100 with a gap therebetween and may further include a separator 500.

The lower transfer part 100 is configured to fix and transfer the lower substrate 11. The lower transfer part 100 may include a lower holding unit 110 which supports a bottom surface of the lower substrate 11 of the stacked structure 10 placed thereon and a lower guide unit 190 which guides the movement path of the lower holding unit 110. The lower transfer part 100 may further include a lower fixing unit 130 which fixes a bottom surface of the stacked structure 10, more specifically, contacts and fixes the bottom surface of the lower substrate 11. The lower transfer part 100 may also further include a lower driving unit (not shown) which moves the lower holding unit 110 to transfer the lower substrate 11, and a plurality of lower connection units 150.

As used herein, a positive direction refers to a direction pointed by an arrow of each axis shown in the drawings, and a negative direction refers to a direction opposite to the direction pointed by the arrow of each axis shown in the drawings. In addition, the symbol "⊙" indicates that an arrow points in a forward direction of the drawings. That is, the symbol "⊙" indicates that the arrow protrudes out of the drawings. In addition, the symbol "⊗" indicates that an arrow points in a backward direction of the drawings. That is, the symbol "⊗" indicates that the arrow points in a direction opposite to the direction indicated by the symbol "⊙". While the XY coordinate system illustrated in the figures shows the X, Y, and Z-axis intersecting in a perpendicular manner, a perpendicularly intersecting coordinate system is not required, and the XY coordinate system can just have the X, Y and Z-axis intersecting.

The stacked structure 10 is placed on the lower holding unit 110. The lower holding unit 110 may be moved under the guidance of path guides (191, 193). The lower holding unit 100 may be coupled to the path guides (191, 193) by the lower connection units 150. The lower holding unit 110 may include, but is not limited to, a plurality of separate auxiliary holding units.

A first side 153 of each of the lower connection units 150 may be fixed to the lower holding unit 110, and a second side 151 of each of the lower connection units 150 may contact the path guides (191, 193). For example, the second sides 151 of the lower connection units 150 may be shaped like rollers and thus roll-contact the path guides (191, 193). However, the present disclosure is not limited thereto.

That is, the shape and configuration of the lower connection units 150 may vary according to the shape and configuration of the path guides (191, 193).

The lower fixing unit 130 may be installed on the lower holding unit 110 to fix the bottom surface of the lower substrate 11. To this end, the lower fixing unit 130 may include, for example, one or more vacuum suction portions (not shown in FIG. 1). For example, the lower fixing unit 130 may include a plurality of vacuum holes formed in the lower holding unit 110 and vacuum-suck the lower substrate 11 placed on the lower holding unit 110. That is, when the lower substrate 11 is placed on the lower holding unit 110, the lower fixing unit 130 may suck in air through the holes, thereby creating a vacuum between the lower holding unit 110 and the lower substrate 11. Accordingly, the lower substrate 11 may be fixed onto the lower holding unit 110. Alternatively, the lower fixing unit 130 may include, for example, a vacuum suction pad or a rubber suction pad formed on the lower holding unit 110, and the vacuum suction pad or the rubber suction pad may have a certain degree of elasticity. That is, all means of suction that have been developed and commercialized or are realizable depending on future technological developments can be used as the lower fixing unit 130 of the present disclosure.

The lower guide unit 190 includes the path guides (191, 193) which guide the movement path of the lower holding unit 110. That is, the lower holding unit 110 moves along the path guides (191, 193) by remaining in contact with the path guides (191, 193), and the lower substrate 11 is fixed on the lower holding unit 110 by the lower fixing unit 130. Consequently, the lower substrate 11 and the lower holding unit 110 are moved together.

The path guides (191, 193) may include a first path guide 191 and a second path guide 193. The first path guide 191 may guide the movement of the lower holding unit 110 in a direction indicated by arrow C, that is, a positive X-axis direction. The second path guide 193 which is continuous with the first path guide 191 may guide the lower holding unit 110 guided by the first path guide 191 in a direction indicated by arrow D having a negative slope in an XY coordinate system, that is, a direction indicated by the sum of the positive X-axis direction and a negative Y-axis direction.

More specifically, when the stacked structure 10 is mounted on the lower holding unit 110, the lower fixing unit 130 may fix the bottom surface of the lower substrate 11 onto the lower holding unit 110. Then, the lower driving unit may move the lower holding unit 110. Accordingly, the lower holding unit 110 may be transferred in the direction indicated by arrow C under the guidance of the first path guide 191 and then transferred in the direction indicated by arrow D under the guidance of the second path guide 193.

There is no restriction on the type of the path guides (191, 193). For example, each of the path guides (191, 193) may include any one of a guide groove, a guide hole and a guide rail, or a combination of the same. However, the present disclosure is not limited thereto. That is, all types of guides that have been developed and commercialized or are realizable depending on future technological developments can be applied to the path guides (191, 193) of the present disclosure.

The specific shapes of the first path guide 191 and the second path guide 193 will be described later.

The upper transfer part 300 is configured to fix and transfer the upper substrate 13. The upper transfer part 300 may include an upper holding unit 310 on which the upper substrate 13 is placed, an upper fixing unit 330 which is disposed in a lower part of the upper holding unit 310 to fix a top surface of the upper substrate 13, and an upper driving unit (not shown) which moves the upper holding unit 310 to transfer the upper substrate 13.

The upper holding unit 310 may form the exterior of the part for transferring the upper substrate 13. The size and shape of the upper holding unit 310 may be designed in view of the size and shape of the upper substrate 13.

The upper fixing unit 330 may be disposed in the lower part of the upper holding unit 310 to fix the upper substrate 13 and may include, for example, vacuum suction portions.

When the stacked structure 10 is placed on the lower transfer part 100, the upper driving unit may move the upper holding unit 310 in a direction indicated by arrow A, that is, the negative Y-axis direction. Accordingly, the upper fixing unit 330 may fix the top surface of the upper substrate 13. Then, the upper driving unit may transfer the upper substrate 13 by moving the upper holding unit 310 in a direction indicated by arrow B, that is, the positive X-axis direction. To guide the movement of the upper holding unit 310 in the direction indicated by arrow A, an upper guide unit 390 may further be installed.

In a first area PA1, the upper substrate 13 and the lower substrate 11 may move at the same velocity. Here, the term 'velocity' denotes a vector value including a direction component and a magnitude component. That is, the distance and direction of travel of the upper substrate 13 in the first area PA1 may be the same as the distance and direction of travel of the lower substrate 11 in the first area PA1. In other words, in the first area PA1, the stacked structure 10 may be transferred along the positive X-axis direction in a state where the upper substrate 13 and the lower substrate 11 are in contact with each other and where the top surface of the upper substrate 13 is fixed by the upper fixing unit 330 and the bottom surface of the lower substrate 11 is fixed by the lower fixing unit 130. That is, the first area PA1 may be defined as an area where the upper substrate 13 and the lower substrate 11 not yet physically separated from each other are simultaneously transferred in the same direction. Alternatively, the first area PA1 may be defined as an area corresponding to the position of the first path guide 191.

In a second area PA2, the upper substrate 13 and the lower substrate 11 may move at different velocities. More specifically, a Y-axis direction component of the movement velocity of the upper substrate 13 may be different from a Y-axis direction component of the movement velocity of the lower substrate 11. For example, the Y-axis direction component of the movement velocity of the upper substrate 13 in the second area PA2 may be substantially zero, and the Y-axis direction component of the movement velocity of the lower substrate 13 in the second area PA2 may have a negative value. Accordingly, the upper substrate 13 and the lower substrate 11 may be gradually separated from each other in the second area PA2. An X-axis direction component of the movement velocity of the upper substrate 13 in the second area PA2 may be the same as or different from an X-axis direction component of the movement velocity of the lower substrate 13 in the second area PA2.

That is, the second area PA2 may be defined as an area where the upper substrate 13 and the lower substrate 11 are separated from each other as they move relative to each other with respect to the Y-axis direction. Alternatively, the second area PA2 may be defined as an area corresponding to the position of the second path guide 193. Because the lower substrate 11 and the upper substrate 13 entering the second area PA2 are gradually separated from a boundary between them, they can be stably separated while minimizing stress applied to the lower substrate 11 or the upper substrate 13, and the speed of separation can be adjusted. Furthermore, it is possible to prevent contact on a top surface of the lower substrate 11 in the substrate separation process, thereby preventing the top surface of the lower substrate 11 from being contaminated in the separation process.

To facilitate the separation of the lower substrate 11 and the upper substrate 13, the substrate separation apparatus may further include the separator 500.

The separator 500 may include, for example, a knife 510 that has a blade with a sharp edge. The knife 510 may partially separate the lower substrate 11 and the upper substrate 13, which are in contact with each other, along the direction of a Z axis intersecting an X axis and a Y axis. That is, the separator 500 may initially separate the lower substrate 11 and the upper substrate 13. The process of separating the upper substrate 13 and the lower substrate 11 using the knife 510 may be performed before the stacked structure 10 enters the second area PA2, that is, while the lower substrate 11 having the lower substrate 11 placed thereon is being guided by the first path guide 191.

In other words, the lower substrate 11 and the upper substrate 13 in contact with each other may be partially separated along the Z-axis direction by the knife 510 of the separator 500, and the stacked structure 10 may be transferred to the second area PA2 after being partially separated by the knife 510. Accordingly, the lower substrate 11 and the upper substrate 13 can be separated more easily in the second area PA2.

To facilitate the process of partially separating the lower substrate 11 and the upper substrate 13 using the knife 510, the stacked structure 10 may be stopped before entering the second area PA2. Then, the process of partially separating the lower substrate 11 and the upper substrate 13 using the knife 510 may be performed while the stacked structure 10 is stationary.

Figure 2:
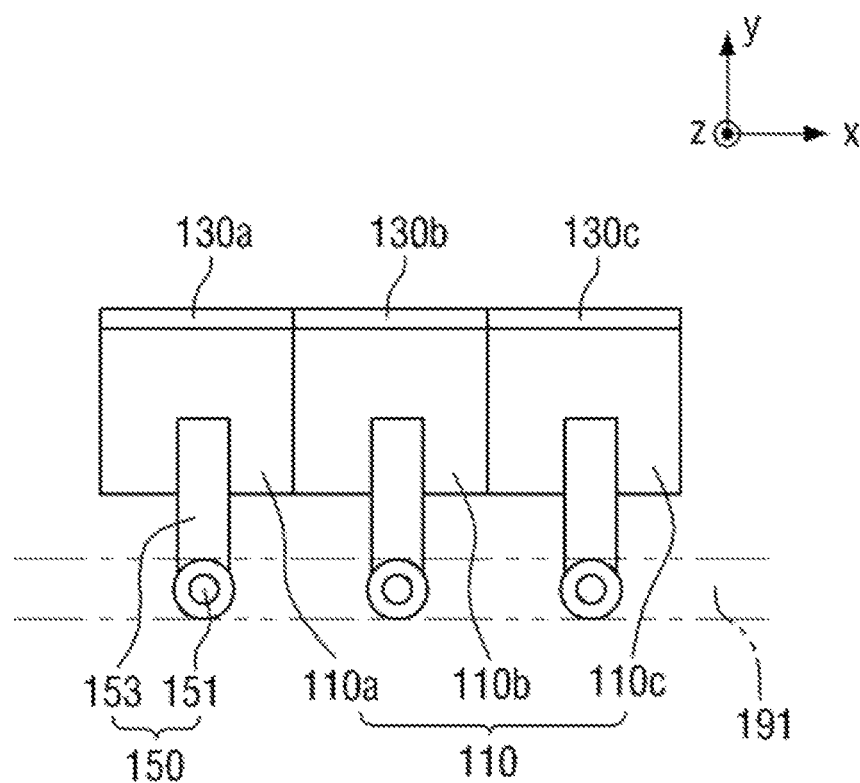
FIGS. 2 and 3 are cross-sectional views illustrating the schematic structure of an embodiment of a lower transfer part shown in FIG. 1.
Figure 3:
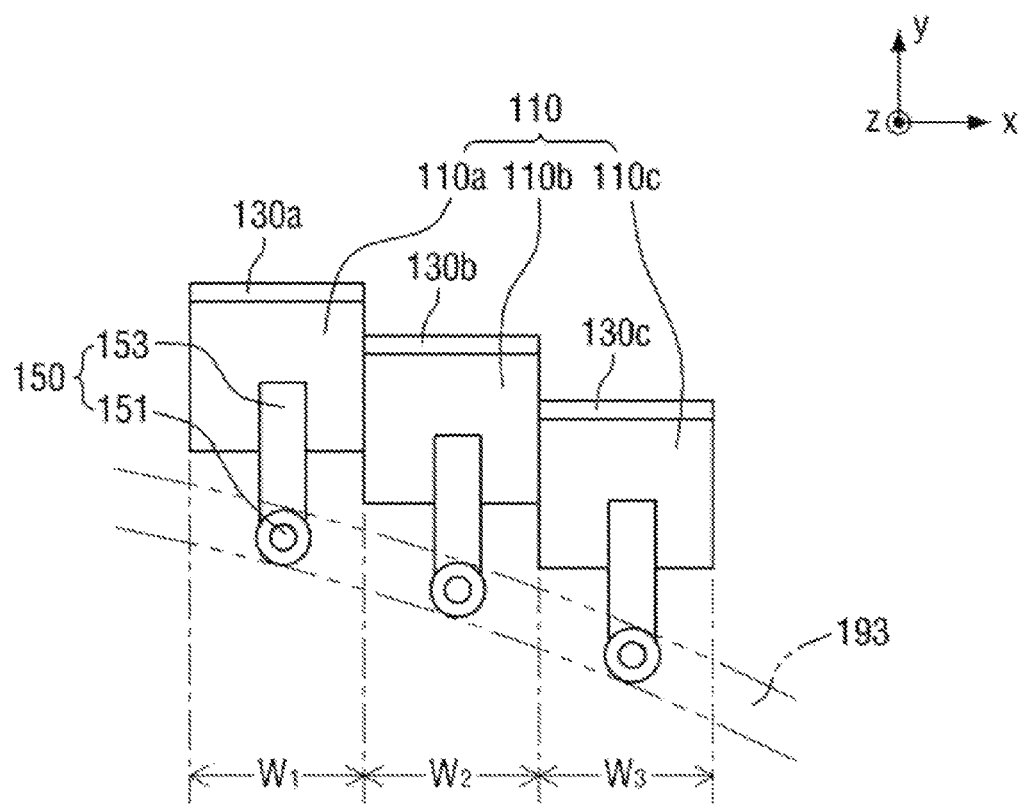

FIGS. 2 and 3 are cross-sectional views illustrating the schematic structure of an embodiment of the lower transfer part 100 shown in FIG. 1.

Referring to FIGS. 2 and 3, a lower holding unit 110 (see FIG. 1) may consist of a plurality of auxiliary holding units 110a through 110c which are separated from each other, and a plurality of lower fixing units 130a through 130c which are separated from each other and which may be installed on the auxiliary holding units 110a through 110c, respectively. The lower fixing units 130a through 130c may be formed in the form of, but not limited to, vacuum holes, vacuum suction pads, or rubber suction pads.

The auxiliary holding units 110a through 110c may be connected to path guides (191, 193) by lower connection units 150, respectively.

Accordingly, when the auxiliary holding units 110a through 110c are guided by a first path guide 191, which is substantially parallel to the X axis, as shown in FIG. 2, top surfaces of the auxiliary holding units 110a through 110b do not form steps therebetween, but are aligned in the same plane and form one flat surface.

When, as shown in FIG. 3, the auxiliary holding units 110a through 110c are guided by a second path guide 193, the top surfaces of the auxiliary holding units 110a through 110c may lie in different planes because the direction of a path formed by the second path guide 193 has a negative slope in the XY coordinate system. That is, because the lower holding unit 110 (see FIG. 1) includes the auxiliary holding units 110a through 110c which are separated from each other and the auxiliary holding units 110a through 110c are moved under the guidance of the second path guide 193, the top surfaces of the auxiliary holding units 110a through 110c may form steps therebetween due to the guidance of the second path guide 193. Accordingly, as the lower holding unit 110 (see FIG. 1) moves along the second path guide 193, the steps (formed by the top surfaces of the auxiliary holding units 110a through 110c) are reflected in the lower substrate 11 (see FIG. 1). Consequently, the lower substrate 11 (see FIG. 1) and the upper substrate 13 (see FIG. 1) can be gradually separated from each other. The auxiliary holding units 110a through 110c may have equal or different widths.

In an example, the three auxiliary holding units 110a through 110c illustrated in the drawings may be defined as a first auxiliary holding unit 110a, a second auxiliary holding unit 110b, and a third auxiliary holding unit 110c. In this case, a width W1 of the first auxiliary holding unit 110a, a width W2 of the second auxiliary holding unit 110, and a width W3 of the third auxiliary holding unit 110c may be equal or different. For example, the respective widths W1 through W3 of the auxiliary holding units 110a through 110c may have various relationships such as W1=W2=W3, W1=W2>W3, W1>W2>W3, and W1>W2=W3. That is, there is no restriction on the relationship among the widths W1 through W3 of the auxiliary holding units 110a through 110c.

In FIG. 3, the lower holding unit 110 (see FIG. 1) includes three separate auxiliary holding units 110a through 110c. However, this is merely an example. That is, there is no restriction on the number of auxiliary holding units that constitute the lower holding unit 110 (see FIG. 1). For ease of description, a case where the lower holding unit 110 (see FIG. 1) includes three separate auxiliary holding units 110a through 110c will be described as an example.

Figure 4:
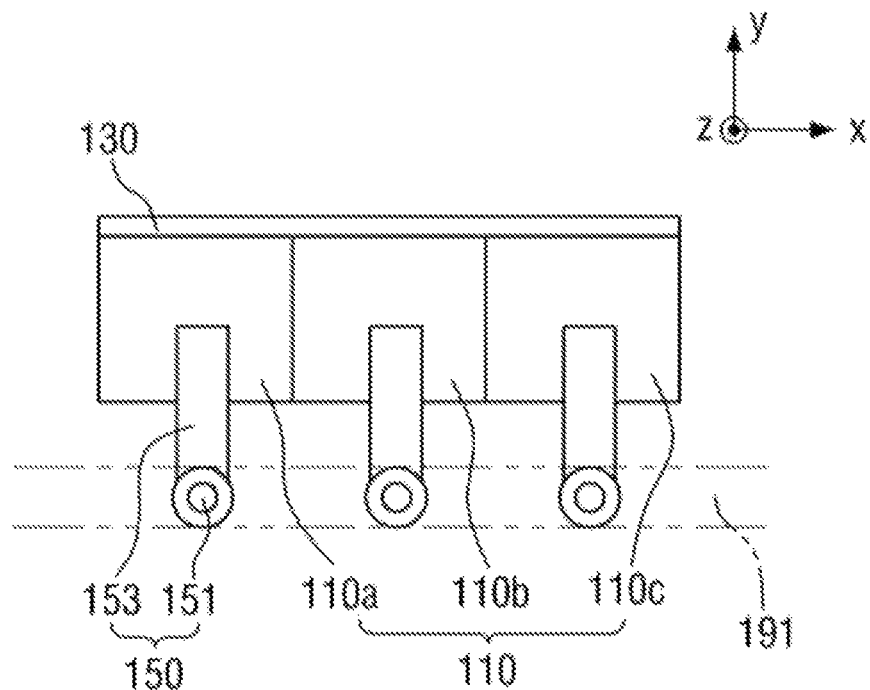
FIGS. 4 and 5 are cross-sectional views illustrating the schematic structure of another embodiment of the lower transfer part shown in FIG. 1.
Figure 5:
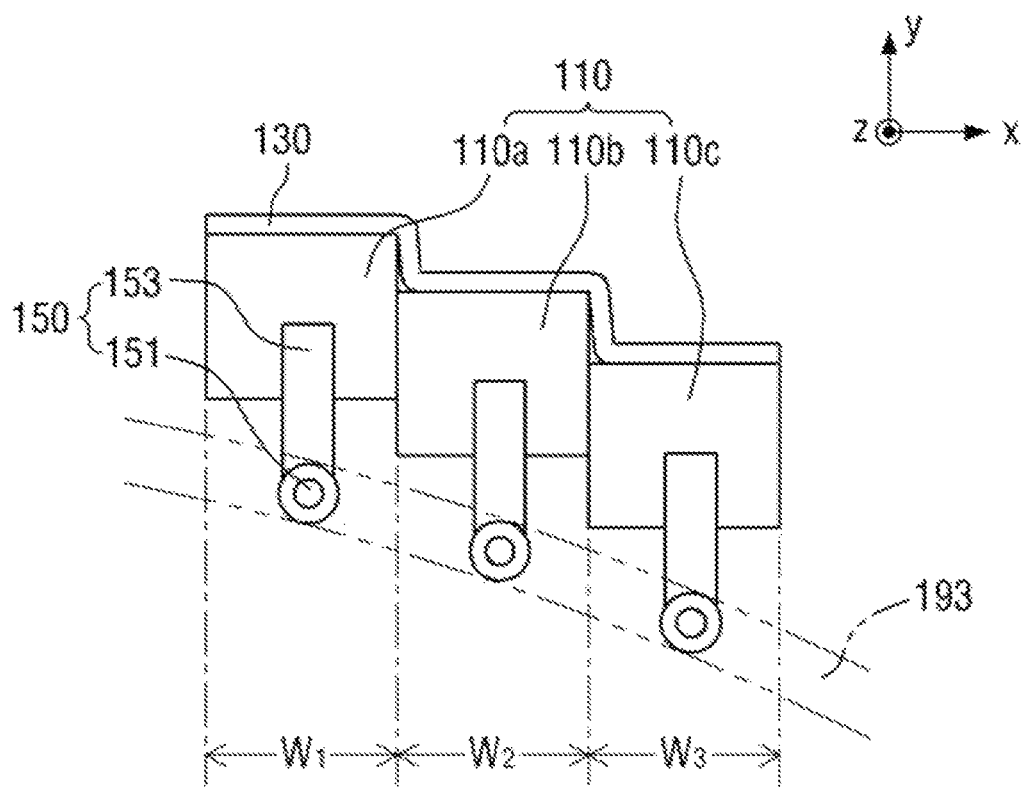

FIGS. 4 and 5 are cross-sectional views illustrating the schematic structure of another embodiment of the lower transfer part 100 shown in FIG. 1.

Referring to FIGS. 4 and 5, a lower holding unit 110 (see FIG. 1) may consist of a plurality of auxiliary holding units 110a through 110c which are separated from each other, and a lower fixing unit 130 formed as a single piece may be installed on the auxiliary holding units 110a through 110c. The lower auxiliary holding units 110a through 110c may be connected to a path guide unit 190 (see FIG. 1) by lower connection units 150, respectively. That is, a lower transfer part according to the current embodiment is partially different from the lower transfer part of FIGS. 2 and 3 in that the lower fixing unit 130 installed on the auxiliary holding units 110a through 110c is formed as a single piece. The lower fixing unit 130 may be a vacuum suction pad or a rubber suction pad and may have elasticity.

Accordingly, when the auxiliary holding units 110a through 110c are guided by a first path guide 191, which is substantially parallel to the X axis, as shown in FIG. 4, top surfaces of the auxiliary holding units 110a through 110c may not form steps therebetween, but form one flat surface.

In addition, when the auxiliary holding units 110a through 110c are guided by a second path guide 193 as shown in FIG. 5, the top surfaces of the auxiliary holding units 110a through 110c may form steps therebetween. As shown in FIG. 5, side surfaces of some (110a, 110b) of the auxiliary holding units 110a through 110c exposed by the steps may be covered with the elastic lower fixing unit 130.

Accordingly, as the lower holding unit 110 (see FIG. 1) moves along the second path guide 193, the steps (formed by the top surfaces of the auxiliary holding units 110a through 110c) are reflected in the lower substrate 11 (see FIG. 1). Consequently, the lower substrate 11 (see FIG. 1) and the upper substrate 13 (see FIG. 1) can be gradually separated from each other. Furthermore, the elastic lower fixing unit 130 can minimize the formation of steep steps in the lower substrate 11 (see FIG. 1).

Figure 6:
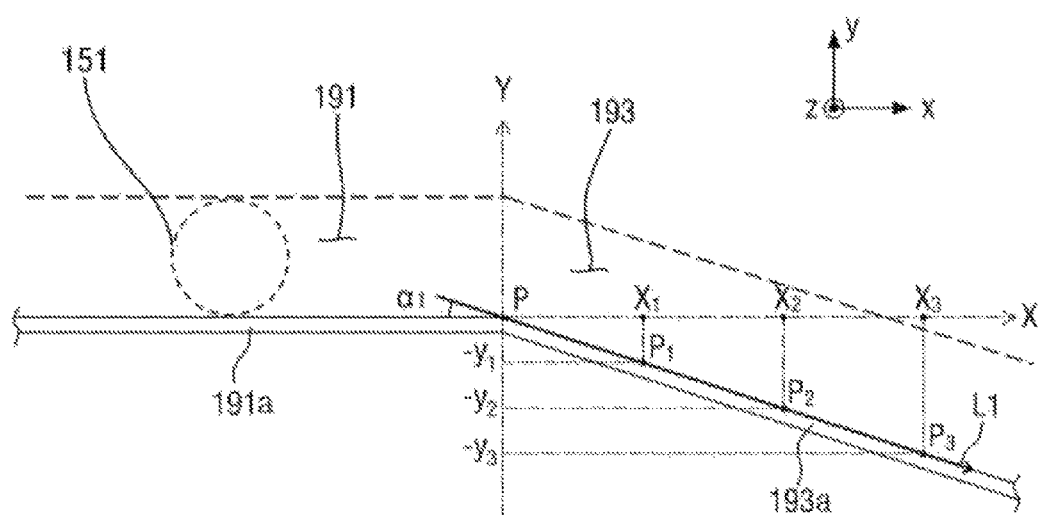
FIG. 6 is a cross-sectional view illustrating an embodiment of a first path guide and a second path guide shown in FIG. 1.

FIG. 6 is a cross-sectional view illustrating an embodiment of the first path guide 191 and the second path guide 193 shown in FIG. 1. More specifically, FIG. 6 is a cross-sectional view schematically illustrating portions of the first path guide 191 and the second path guide 193 which contact the second sides 151 of the lower connection units 150 described above with reference to FIG. 1.

Referring to FIG. 6, a first path guide 191 according to the current embodiment may be parallel to the X axis. For example, a surface (hereinafter, referred to as a 'first path guide surface' 191a) of the first path guide 191 which contacts the second sides 151 of the lower connection units 150 may be parallel to the X axis. The lower holding unit 110 (see FIG. 1) guided by the first path guide 191 and the lower substrate 11

(see FIG. 1) fixed to the lower holding unit 110 by the lower fixing unit 130 may be transferred in the positive X-axis direction. A second path guide 193 is continuous with the first path guide 191, and the lower holding unit 110 (see FIG. 1) guided by the second path guide 193 moves in the negative Y-axis direction as well as in the positive X-axis direction. That is, the lower holding unit 110 (see FIG. 1) guided by the second path guide 193 is transferred in a direction having a negative slope in the XY coordinate system.

A surface (hereinafter, referred to as a 'second path guide surface' 193a) of the second path guide 193 which contacts the second sides 151 of the lower connection units 150 may be formed along a straight line L1 having a negative slope. The slope of the straight line L1 may be constant. For example, assuming that a portion of a boundary between the first path guide 191 and the second path guide 193 which contacts the second sides 151 of the lower connection units 150 (see FIG. 1), that is, an intersection point of the first path guide surface 191a and the second path guide surface 193a is the origin P of the XY coordinate system, the origin P may have coordinate values of (0, 0). In addition, a first position P1, a second position P2, and a third position P3 on the second path guide surface 193a may have coordinate values of (x1, −y1), (x2, −y2) and (x3, −y3), respectively, where xn and yn have positive real number values, and n is a positive integer. Here, a slope of a straight line that contacts the first position P1, a slope of a straight line that contacts the second position P2, and a slope of a straight line that contacts the third position P3 may be equal. That is, the first position P1, the second position P2 and the third position P3 projected onto the XY coordinate system may be located on the same straight line L1 in the XY coordinate system. In other words, a guide path formed by the second path guide 193 or the second path guide surface 193a may be in the form of a straight line in the XY coordinate system.

An acute angle α1 formed by the straight line L1 and a positive X axis in the XY coordinate system may be, for example, in a range of greater than 0 to 45 degrees. That is, an angle formed by the second path guide surface 193a and the first path guide surface 191a may be in a range of greater than 135 to less than 180 degrees. However, this is merely an example, and the angle formed by the first path guide 191 and the second path guide 193 or the angle formed by the first path guide surface 191a and the second path guide surface 193a may be changed if necessary.

Figure 7:
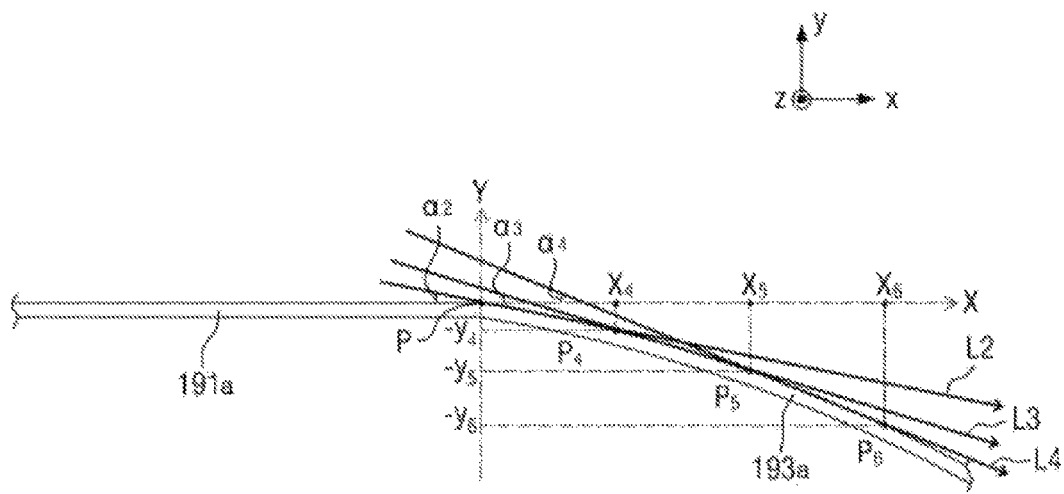
FIG. 7 is a cross-sectional view illustrating another embodiment of the first path guide and the second path guide shown in FIG. 1.

FIG. 7 is a cross-sectional view illustrating another embodiment of the first path guide 191 and the second path guide 193 shown in FIG. 1. The structure shown in FIG. 7 is identical to the structure shown in FIG. 6 except for the shape of the second path guide 193.

Referring to FIG. 7, a second path guide surface 193a which contacts the second sides 151 (see FIG. 6) of the lower connection units 150 may be formed along a curve that contacts straight lines L2, L3 and L4 having negative slopes. The slopes of the straight lines L2, L3 and L4 may increase as the distance from a first path guide 191 (see FIG. 6) or a first path guide surface 191a increases. For example, assuming that an intersection point of the first path guide surface 191a and the second path guide surface 193a is the origin P of the XY coordinate system, the origin P may have coordinate values of (0, 0). In addition, a fourth position P4, a fifth position P5, and a sixth position P6 on the second path guide surface 193a may have coordinate values of (x4, −y4), (x5, −y5) and (x6, −y6), respectively. Here, the slope of the straight line L2 that contacts the fourth position P4 may be gentler than the slope of the straight line L3 that contacts the fifth position P5, and the slope of the straight line L3 that contacts the fifth position P5 may be gentler than the slope of the straight line L4 that contacts the sixth position P6. That is, acute angles α2, α3 and α4 formed by the positive X axis and the straight lines L2, L3 and L4 that respectively contact the fourth position P4, the fifth position P5 and the sixth position P6 may increase as the distance from the first path guide 191 increases, and the relationship among the acute angles α2, α3 and α4 may be α2<α3<α4. In summary, an absolute value of the slope of each straight line may increase as the distance from the first path guide 191 (see FIG. 6) or the first path guide surface 191a increases.

In the current embodiment, a guide path formed by the second path guide 193 or the second path guide surface 193a may be in the form of a curve whose center of curvature in the XY coordinate system is located in a lower part of the drawing (not shown).

Figure 8:
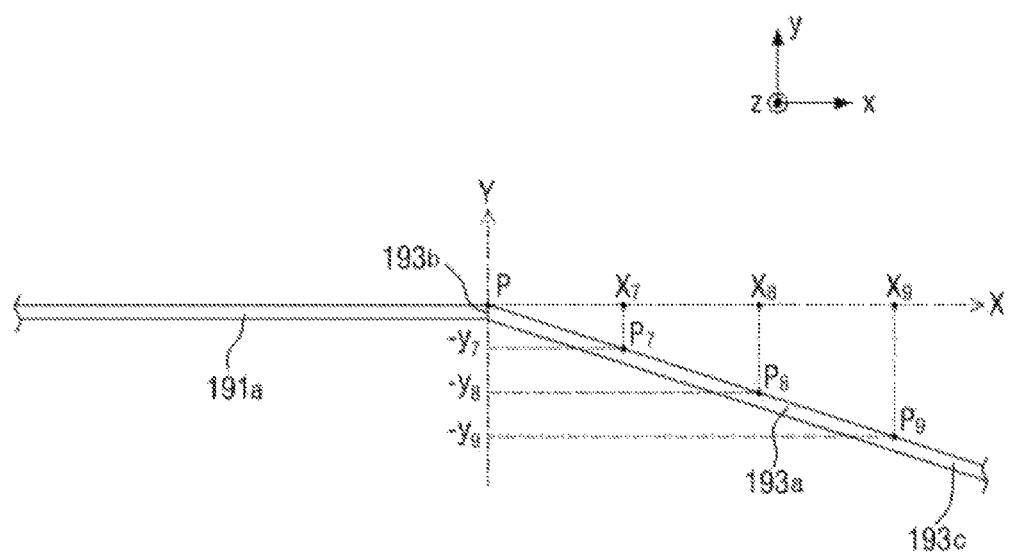
FIG. 8 is a cross-sectional view illustrating another embodiment of the first path guide and the second path guide shown in FIG. 1.

FIG. 8 is a cross-sectional view illustrating another embodiment of the first path guide 191 and the second path guide 193 shown in FIG. 1.

Referring to FIG. 8, a first side 193b of a second path guide surface 193a according to the current embodiment may be continuous with a first path guide surface 191a, and a second side 193c thereof may be located at a lower position than the first path guide surface 191a. A step or height difference between the first path guide surface 191a and the second path guide surface 193a may gradually increase from the first side 193b of the second path guide surface 193a toward the second side 193c. That is, the second path guide surface 193a may form a surface sloping in a direction from the first side 193b toward the second side 193c. Accordingly, a second path guide may form a guide path sloping downward.

In the current embodiment, the height difference between the first path guide surface 191a and the second path guide surface 193a may increase at a constant rate from the first side 193b of the second path guide surface 193a toward the second side 193c. For example, assuming that a boundary between the first path guide surface 191a and the second path guide surface 193a is the origin P of the XY coordinate system, the origin P may have coordinate values of (0, 0). In addition, a seventh position P7, an eighth position P8, and a ninth position P9 on the second path guide surface 193a may have coordinates of (x7, −y7), (x8, −y8) and (x9, −y9), respectively. Here, y7/x7=y8/x8=y9/x9 or (y8−y7)/(x8−x7)=(y9−y8)/(x9−x8). That is, the height difference between the second path guide surface 191a and the second path guide surface 193a may increase at a constant rate as the distance from the first path guide surface 191a increases. Accordingly, the second path guide surface 193a may form a guide path sloping in a direction from the first side 193b toward the second side 193c.

Figure 9:
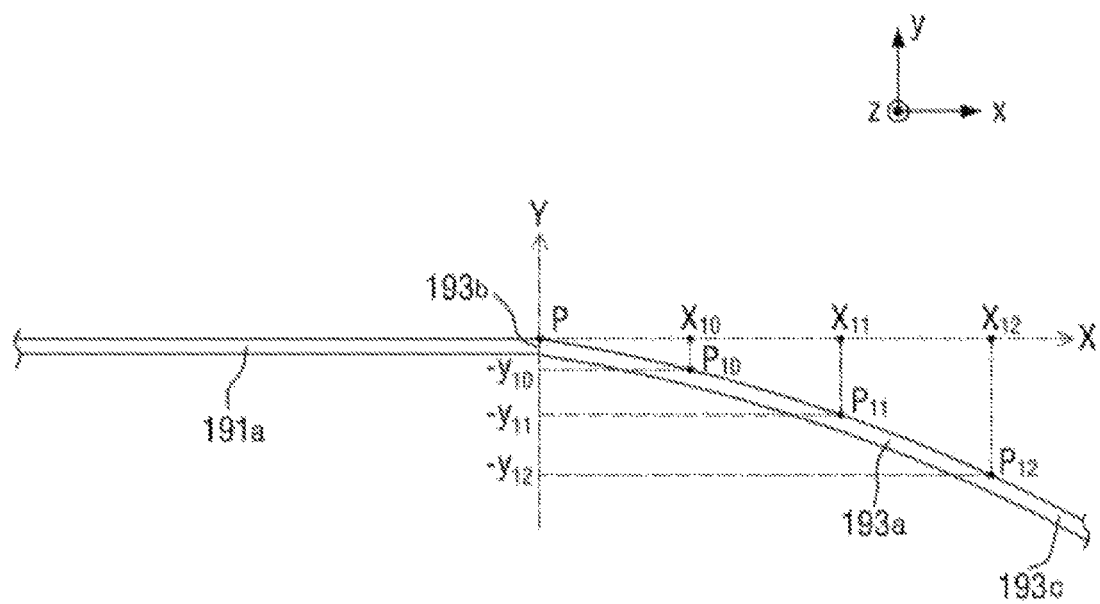
FIG. 9 is a cross-sectional view illustrating another embodiment of the first path guide and the second path guide shown in FIG. 1.

FIG. 9 is a cross-sectional view illustrating another embodiment of the first path guide 191 and the second path guide 193 shown in FIG. 1. The structure shown in FIG. 9 is identical to the structure shown in FIG. 8 except for the second path guide 193.

Referring to FIG. 9, in the current embodiment, a rate of increase in a height difference between a first path guide surface 191a and a second path guide surface 193a may increase from a first side 193b of the second path guide surface 193a toward a second side 193c. For example, assuming that a boundary between the first path guide surface 191a and the second path guide surface 193a is the origin P of the XY coordinate system, the origin P may have coordinates of (0, 0). In addition, a tenth position P10, an eleventh position P11, and a twelfth position P12 on the second path guide surface 193a may have coordinates of (x10, −y10), (x11, −y11) and (x12, −y12), respectively. Here, y10/x10<y11/ x11<y12/x12 or (y11−y10)/(x11−x10)<(y12−y11/(x12−x11). That is, the height difference between the first path guide surface 191a and the second path guide surface 193a may increase as the distance from the first path guide surface 191a in the positive X-axis direction increases. Also, the rate of increase in the height difference may increase as the distance from the first path guide surface 191a increases. Accordingly, a guide path formed by a second path guide 193 (see FIG. 1) may be in the form of a curve whose center of curvature in the XY coordinate system is located in a lower part of the drawing (not shown). In other words, the second path guide surface 193a may be a curved surface whose center of curvature in the XY coordinate system is located in the lower part of the drawing.

Figure 10:
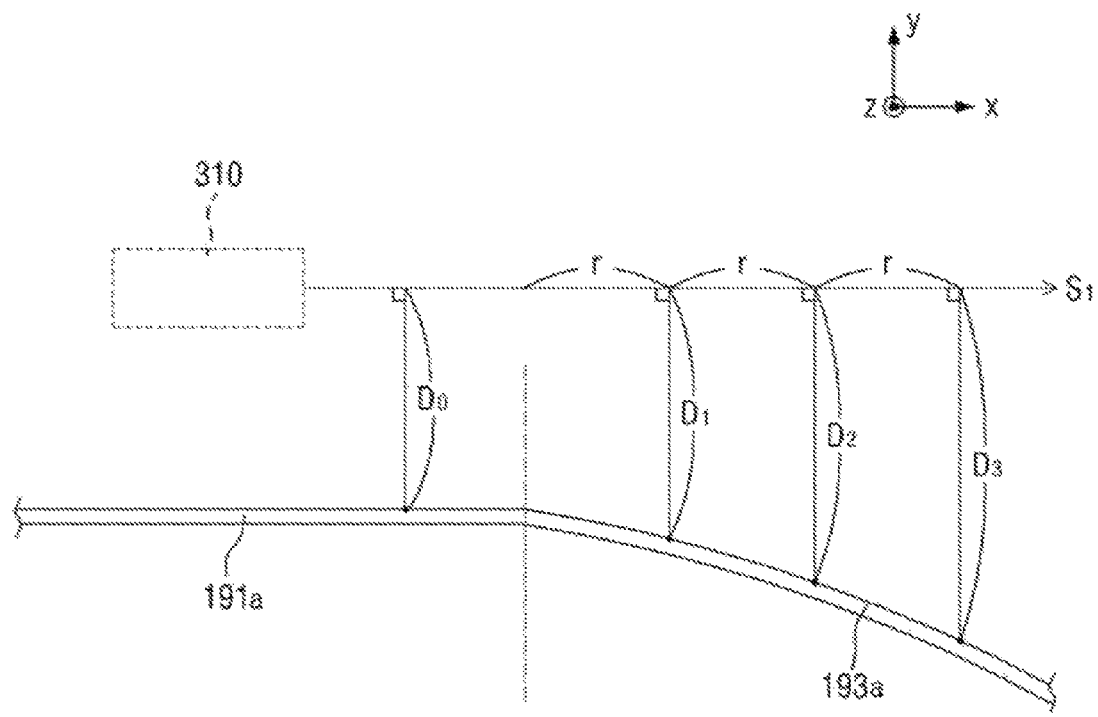
FIG. 10 is a cross-sectional view of another embodiment of the first path guide and the second path guide shown in FIG. 1.

FIG. 10 is a cross-sectional view of another embodiment of the first path guide 191 and the second path guide 193 shown in FIG. 1.

Referring to FIG. 10, the upper holding unit 310 may move along a straight line S1 at the same time as the upper substrate 13 (see FIG. 1).

The lower substrate 11 (see FIG. 1) may be transferred in a state where it is fixed on the lower holding unit 110. The lower holding unit 110 (see FIG. 1) may be connected to a first path guide 191 and a second path guide 193 by the lower connection units 150 and guided by the first path guide 191 and the second path guide 193.

The lower holding unit 110 guided by the first path guide 191 may be transferred parallel to the upper substrate 13 (see FIG. 1), and a vertical distance D0 from a straight line S1 to a portion (i.e., a first path guide surface 191a) of the first path guide 191 (see FIG. 1) which contacts the second sides 151 (see FIG. 1) of the lower connection units 150 (see FIG. 1) may be constant.

The second path guide 193 (see FIG. 1) slopes downward from the first path guide 191 (see FIG. 1). A vertical distance from the straight line S1 to a portion (i.e., a second path guide surface 193a) of the second path guide 193 (see FIG. 1) which contacts the second sides 151 of the lower connection units 150 may gradually increase. For example, if the upper holding unit 310 is moved by r, 2r and 3r from a boundary between the first path guide 191 and the second path guide 193, vertical distances from the straight line S1 to the second path guide surface 193a may be D1, D2 and D3. In this case, D0<D1<D2<D3.

Here, D1−D0=D2−D1=D3−D2. In this case, the second path guide 193 (see FIG. 1) or the second path guide surface 193a may form a guide path shaped like a straight line sloping downward. Also, D1−D0<D2−D1<D3−D2. In this case, the second path guide 193 (see FIG. 1) or the second path guide surface 193a may form a guide path shaped like a curve sloping downward, as shown in FIG. 10.

That is, there is no restriction on the shape of the second path guide 193 (see FIG. 1) or the second path guide surface 193a as long as the relationship among the above vertical distances satisfies 0<D1<D2<D3.

Figure 11:
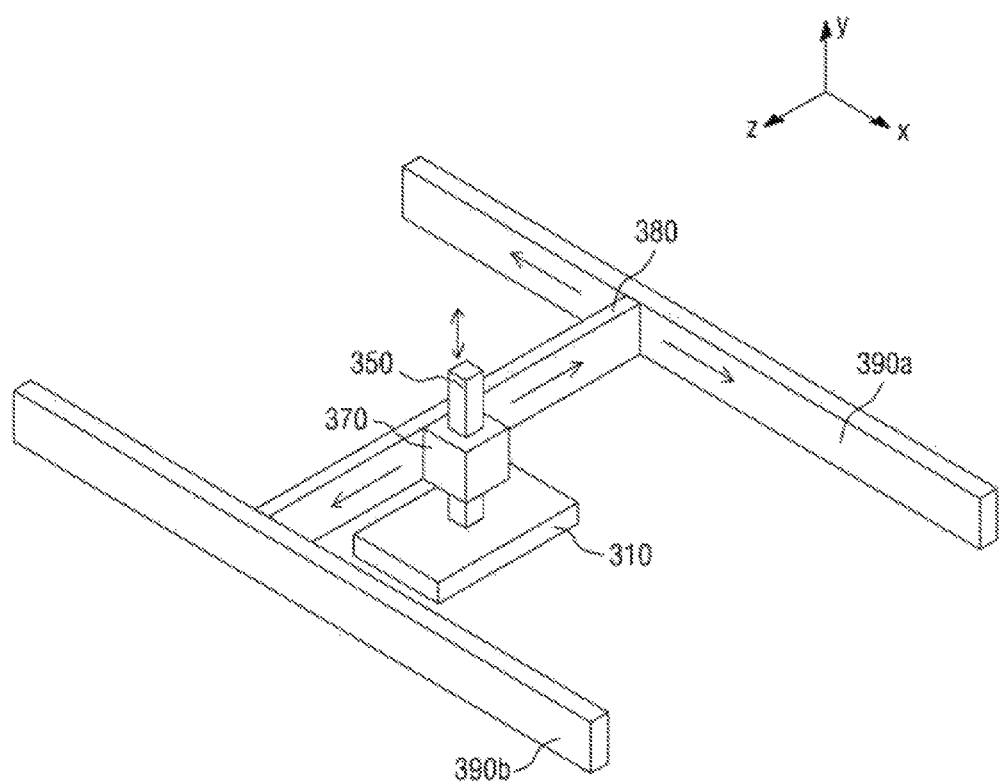
FIG. 11 is a perspective view illustrating the schematic structure of an upper transfer part shown in FIG. 1.

FIG. 11 is a perspective view illustrating the schematic structure of the upper transfer part 300 shown in FIG. 1.

Referring to FIG. 11, the upper transfer part 300 according to the present disclosure may include the upper holding unit 310, the upper fixing unit (not shown) and the upper driving unit (not shown), and may further include a first upper support 350, a second upper support 370, a third upper support 380, and upper guides 390a and 390b.

The first upper support 350 is connected to a top surface of the upper holding unit 310 so as to support the upper holding unit 310. The first upper support 350 is moved in the Y-axis direction by the upper driving unit (not shown), thereby raising or lowering the upper holding unit 310. The movement of the first upper support 350 in the Y-axis direction may be guided by the second upper support 370.

The second upper support 370 may be connected to the third upper support 380. The second upper support 370 may be moved in the Z-axis direction by the upper driving unit (not shown), thereby moving the upper holding unit 310. Here, the movement of the second upper support 370 may be guided by the third upper support 380.

The third upper support 380 may be moved in the X-axis direction by the upper driving unit (not shown), thereby moving the upper holding unit 310. Here, the movement of the third upper support 380 may be guided by the upper guides 390a and 390b. As shown in the drawing, the upper guides 390a and 390b may contact both ends of the third upper support 380.

The above coupling relationship among the first upper support 350, the second upper support 370, and the third upper support 380 is merely an example, and the present disclosure is not limited thereto. That is, there is no restriction on the coupling relationship among the first upper support 350, the second upper support 370 and the third upper support 380, and the coupling relationship among them can be changed appropriately. Furthermore, any one of the first upper support 350, the second upper support 370 and the third upper support 380 can be omitted or can be integrally formed with another one.

Figure 12:
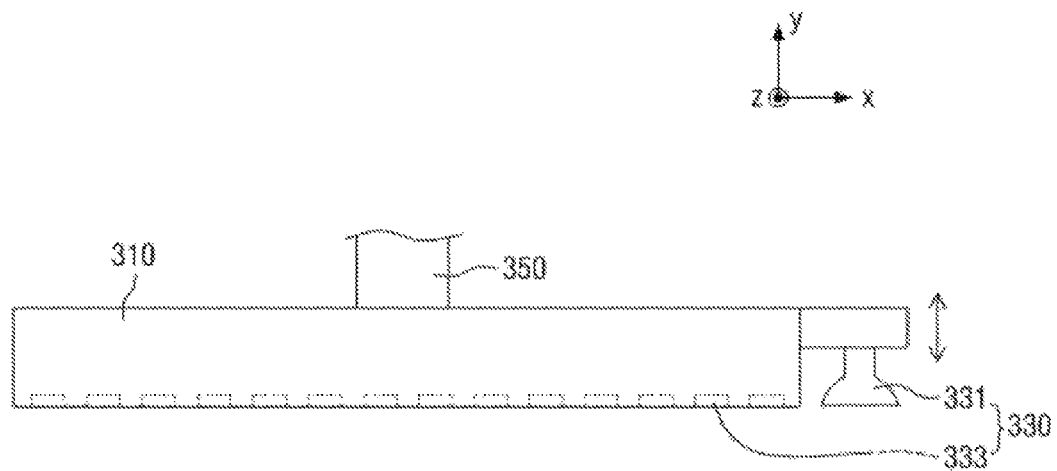
FIGS. 12 and 13 are a cross-sectional view and a bottom view illustrating the schematic structure of an embodiment of an upper fixing unit shown in FIG. 1.
Figure 13:
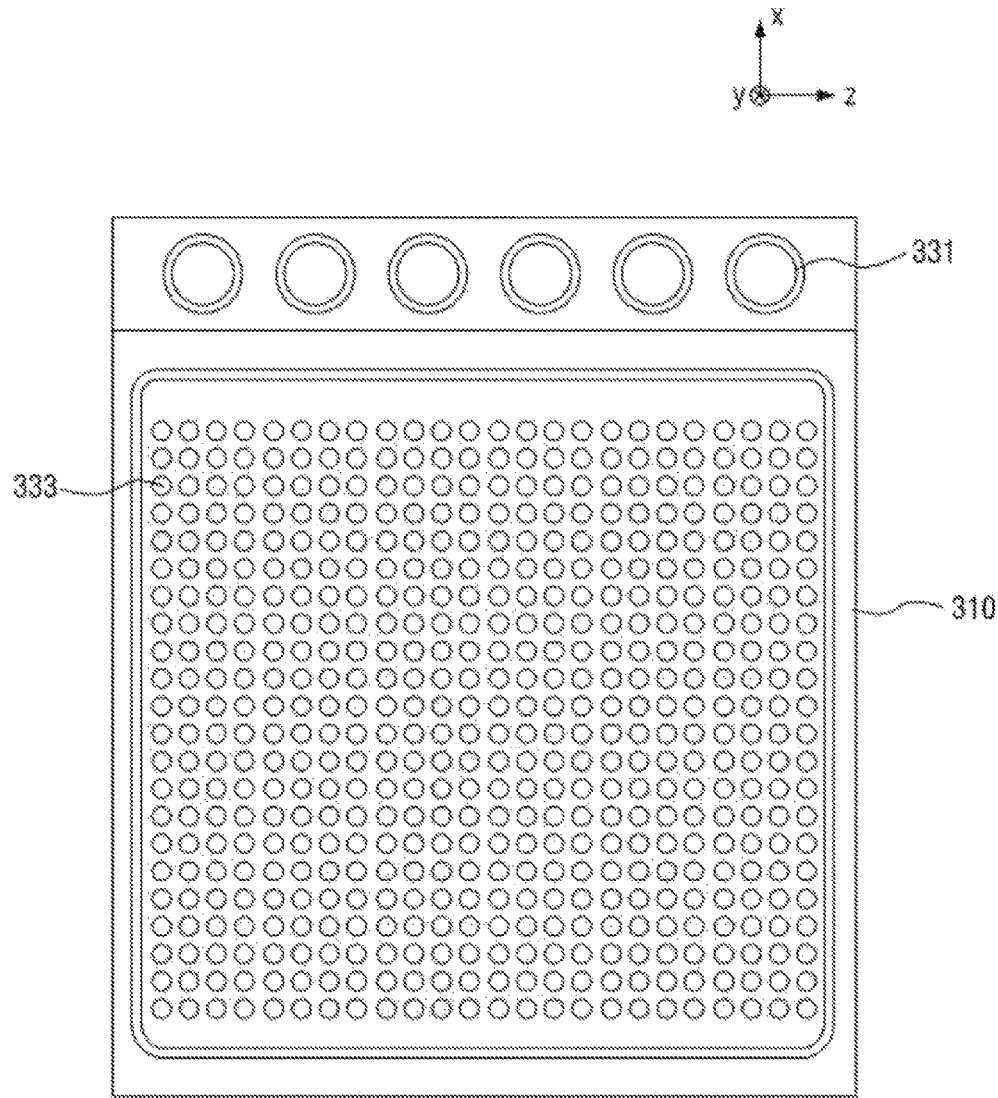

FIGS. 12 and 13 are a cross-sectional view and a bottom view illustrating the schematic structure of an embodiment of the upper fixing unit 330 shown in FIG. 1.

Referring to FIGS. 12 and 13, an upper fixing unit 330 may be disposed on a bottom surface of the upper holding unit 310 as described above with reference to FIG. 1. The upper fixing unit 330 may include, for example, vacuum suction portions so as to fix the top surface of the upper substrate 13 to the upper holding unit 310 by suction.

More specifically, the upper fixing unit 330 may include a plurality of first vacuum suction portions 331 provided along an edge portion of the bottom surface of the upper holding unit 310 and a plurality of second vacuum suction portions 333 formed in a portion of the bottom surface of the upper holding unit 310 where the first vacuum suction portions 331 are not formed.

The first vacuum suction portions 331 for vacuum-sucking a side of the top surface of the upper substrate 13 are configured to have a strong suction force. As shown in FIGS. 12 and 13, the first vacuum suction portions 331 may be arranged in a line at an edge of the bottom surface of the upper holding unit 310. While the first vacuum suction portions 331 are formed at only one edge of the bottom surface of the upper holding unit 310 in the drawing, this is merely an example, and the first vacuum suction portions 331 can additionally be formed at another edge. There is no restriction on the form of the first vacuum suction portions 331. For example, the first vacuum suction portions 331 may be formed in the form of vacuum holes. To have a stronger suction force, the first vacuum suction portions 331 may be formed in the form of suckers as shown in FIGS. 12 and 13.

The second vacuum suction portions 333 may be located in a portion of the bottom surface of the upper holding unit 310 excluding a portion where the first vacuum suction portions 331 are formed, as shown in FIG. 13. The second vacuum suction portions 333 may vacuum-suck the top surface of the upper substrate 13, excluding the edges of the top surface. The second vacuum suction portions 333 are not required to have as strong of a suction force as the first vacuum suction portions 331. Thus, the second vacuum suction portions 333 may be formed in the form of, but not limited to, vacuum holes.

Although not shown in the drawings, the upper fixing unit 330 may further include an auxiliary upper driving unit. The auxiliary upper driving unit may move the first vacuum suction portions 331 in the Y-axis direction, as indicated in FIG. 12 by the arrows next to vacuum suction portions 331, and may be formed in the form of, but not limited to, a cylinder. The vacuum suction portion 331 moves independently of the upper holding unit 310 as indicated by the up and down arrow in FIG. 12.

Figure 14:
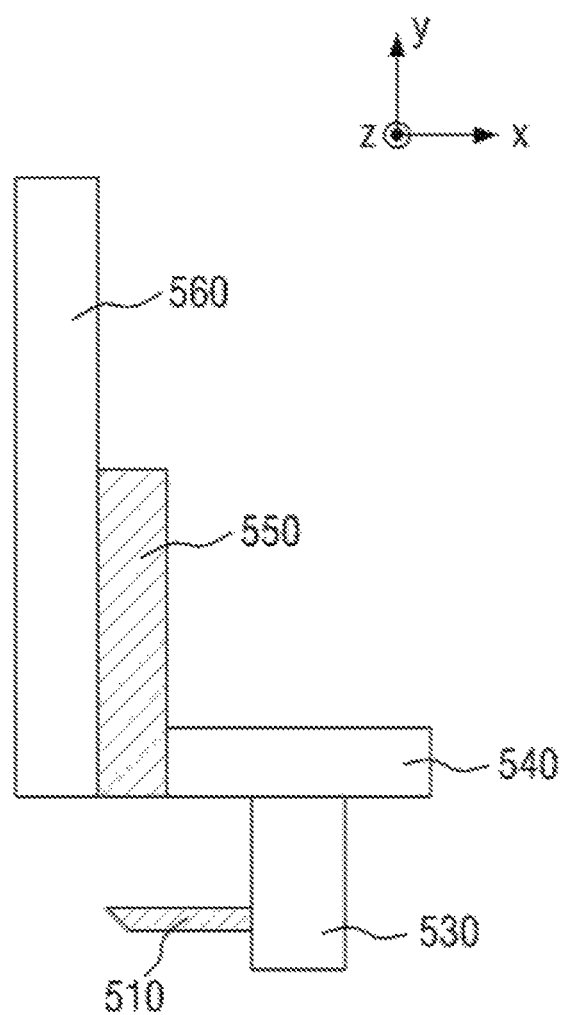
FIGS. 14 and 15 are a cross-sectional view and a perspective view illustrating the schematic structure of an embodiment of a separator shown in FIG. 1.
Figure 15:
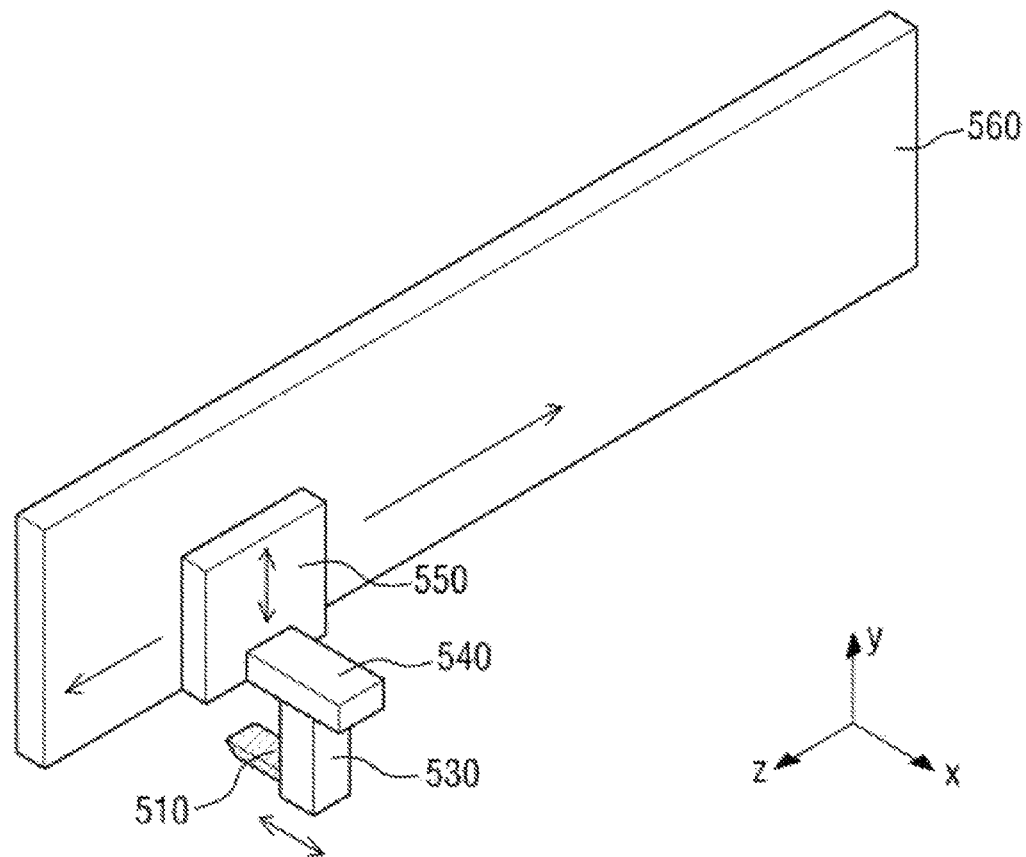

FIGS. 14 and 15 are a cross-sectional view and a perspective view illustrating the schematic structure of an embodiment of the separator 500 shown in FIG. 1.

Referring to FIGS. 14 and 15, a separator 500 according to the current embodiment may include a knife 510, having a blade with a sharp edge, and a knife driving unit (not shown) for moving the knife 510 and may further include at least one of a first knife support 530, a second knife support 540, a third knife support 550 and a fourth knife support 560.

The first knife support 530 may support the knife 510 by fixing the knife 510 to a side thereof. The first knife support 530 may be moved in the X-axis direction by the knife driving unit (not shown), thereby moving the knife 510. The movement of the first knife support 530 in the X-axis direction may be guided by, but not limited to, the second knife support 540.

The second knife support 540 may be connected to the third knife support 550. The second knife support 540 may be moved in the Y-axis direction by the knife driving unit (not shown), thereby moving the knife 510 in the Y-axis direction. The movement of the second knife support 540 may be guided by, but not limited to, the third knife support 550.

The third knife support 550 may be moved in the Z-axis direction by the knife driving unit (not shown), thereby moving the knife 510. Here, the movement of the third knife support 550 may be guided by the fourth knife support 560 which supports the third knife support 550.

However, the above coupling relationship among the first through fourth knife supports 530 through 560 is merely an example, and the present disclosure is not limited thereto. That is, there is no restriction on the coupling relationship among the first through fourth knife supports 530 through 560, and the coupling relationship among them can be changed if necessary. In addition, any one of the first through fourth knife supports 530 through 560 can be omitted.

Figure 16:
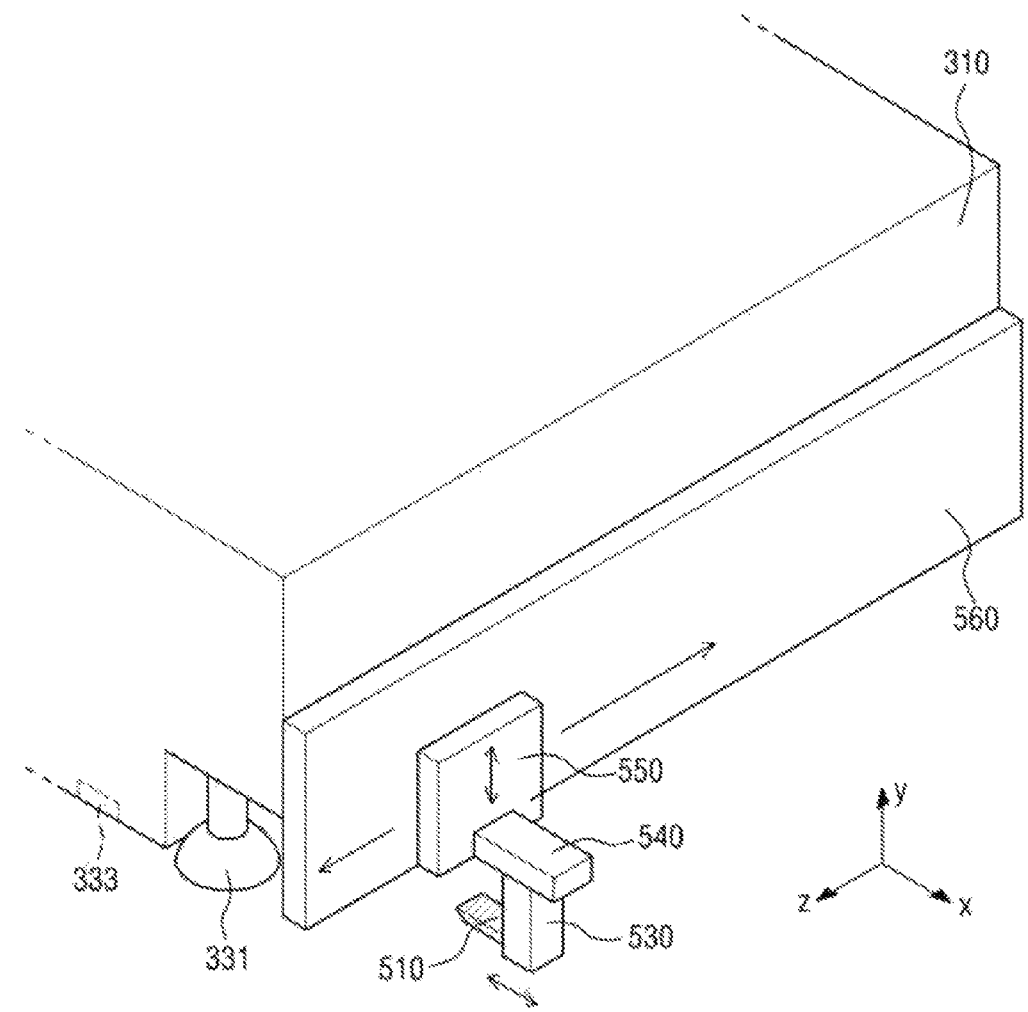
FIG. 16 is a perspective view illustrating the schematic structure of another embodiment of the separator shown in FIG. 1.

FIG. 16 is a perspective view illustrating the schematic structure of another embodiment of the separator 500 and upper transfer part 300 shown in FIG. 1. The structure of a separator 500 shown in FIG. 16 is basically identical to the structure shown in FIG. 15.

Referring to FIG. 16, the separator 500 according to the current embodiment may be formed integrally with the upper transfer part 300. For example, a fourth knife support 560 of the separator 500 may be connected to the upper holding unit 310 of the upper transfer part 300. Accordingly, the separator 500 may move in accordance with the movement of the upper holding unit 310 in a transfer process of the upper substrate 13 (see FIG. 1) fixed by the upper fixing unit 300 (331, 333).

Figure 17:
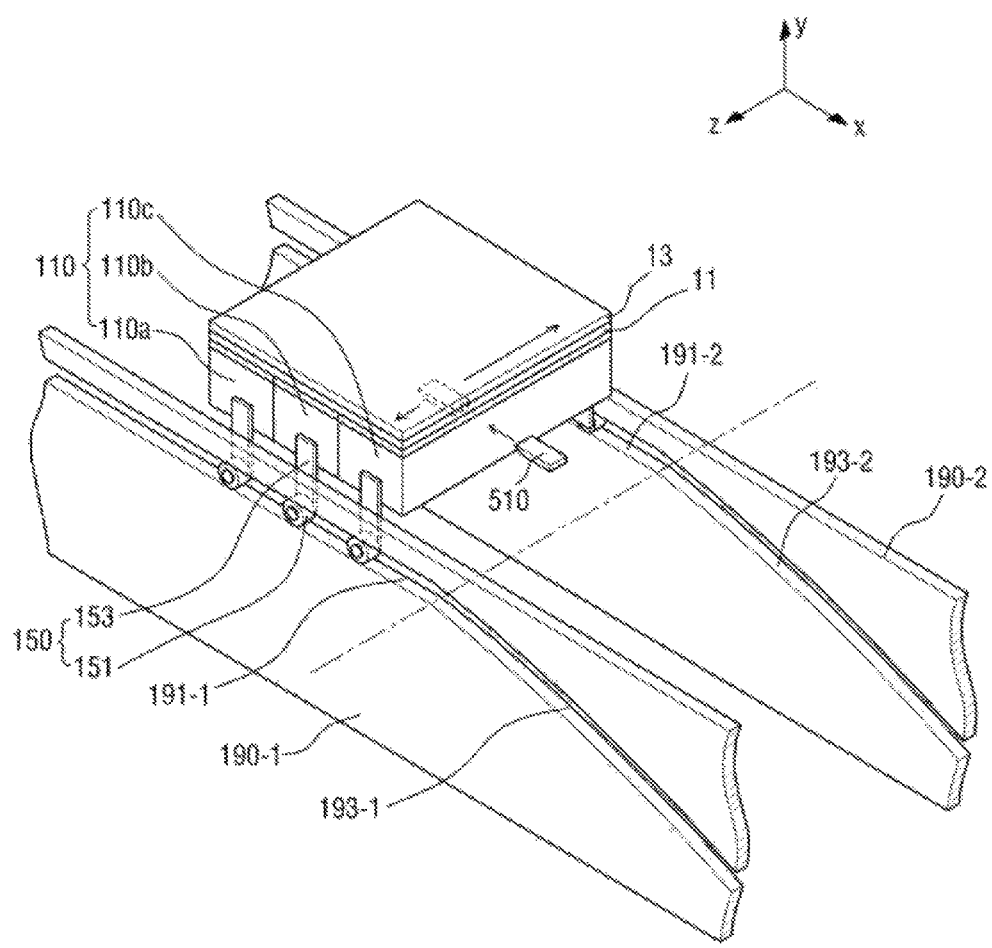
FIG. 17 is a perspective view illustrating the operation of the separator according to an embodiment.

FIG. 17 is a perspective view illustrating the operation of the separator 500 according to an embodiment.

Referring to FIG. 17, the knife 510 of the separator 500 may move in the negative X-axis direction to be inserted between the lower substrate 11 and the upper substrate 13. Then, the knife 510 may move along the Z-axis direction, thereby partially separating the lower substrate 11 and the upper substrate 13 which are in contact with each other. There is no restriction on the movement path of the knife 510 in the Z-axis direction. In an example, the knife 510 inserted between the lower substrate 11 and the upper substrate 13 by moving in the negative X-axis direction may partially separate the upper substrate 13 and the lower substrate 11 by moving along the positive Z-axis direction and then partially separate the upper substrate 13 and the lower substrate 11 again by moving along the negative Z-axis direction. Alternatively, the knife 510 may partially separate the upper substrate 13 and the lower substrate 11 by moving in the negative Z-axis direction and then in the positive Z-axis direction. This occurs in the first area PA1 (FIG. 1) of the substrate separation apparatus.

Figure 18:
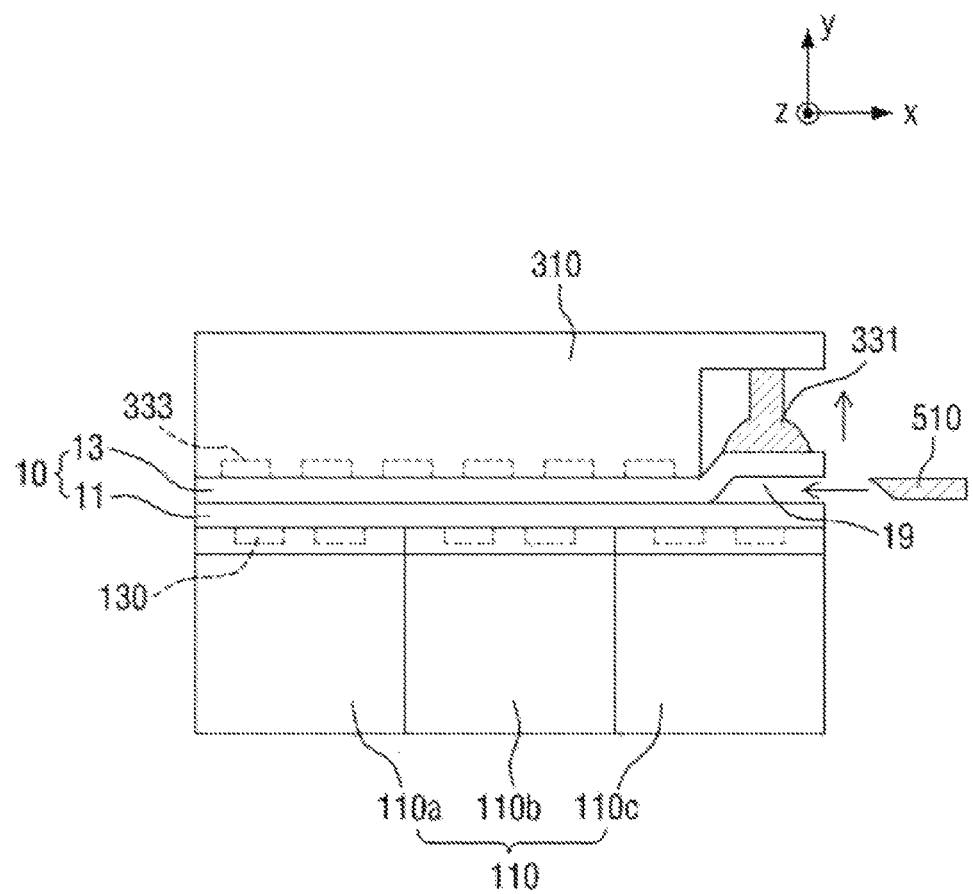
FIG. 18 is a schematic cross-sectional view illustrating the operation of the upper fixing unit and the separator according to an embodiment.

FIG. 18 is a schematic cross-sectional view illustrating the operation of the upper fixing unit 330 and the separator 500 according to an embodiment.

Referring to FIG. 18, as the upper fixing unit 330, the first vacuum suction portions 331 and the second vacuum suction portions 333 may be disposed under or in the lower part of the upper holding unit 310 as described above with reference to FIGS. 12 and 13. In a state where the top surface of the upper substrate 13 is fixed by the first vacuum suction portions 331 and the second vacuum suction portions 333 and where the bottom surface of the lower substrate 11 is fixed by the lower fixing unit 130 of the lower holding unit 110, the first vacuum suction portions 331 may be moved in the positive Y-axis direction by the auxiliary upper driving unit. Accordingly, a portion of an edge of the upper substrate 13 may be raised in an upward direction, that is, in the positive Y-axis direction, and a gap 19 may be formed between surfaces of the upper substrate 13 and the lower substrate 11 in the negative X-axis direction. In this state, the knife 510 may be inserted into the gap 19 by moving in the negative X-axis direction and may partially separate the upper substrate 13 and the lower substrate 11 in contact with each other by moving in the Z-axis direction. That is, according to the current embodiment, because the gap 19 is formed between the lower substrate 11 and the upper substrate 13 using the first vacuum suction portions 331, the knife 510 can be inserted more easily between the two substrates 11 and 13.

Figure 19:
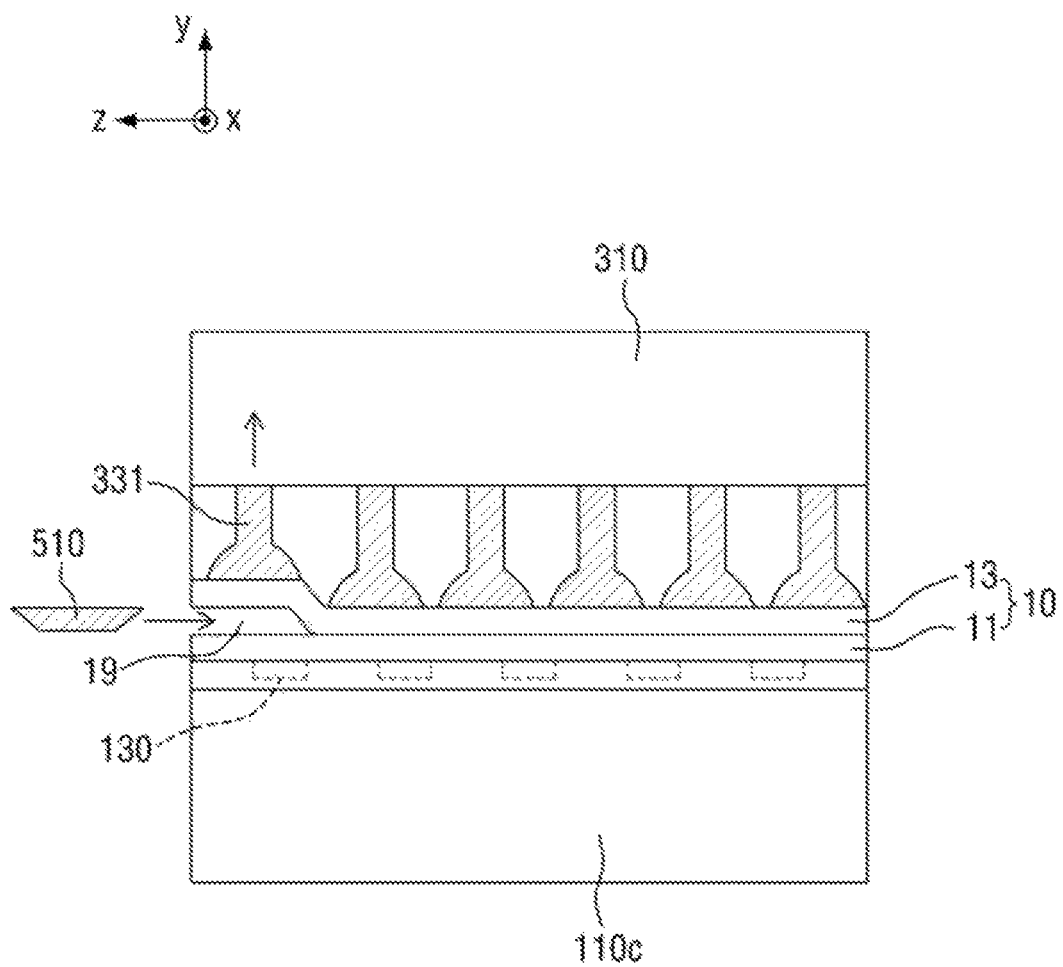
FIG. 19 is a schematic cross-sectional view illustrating the operation of the upper fixing unit and the separator according to another embodiment.

FIG. 19 is a schematic cross-sectional view illustrating the operation of the upper fixing unit 330 and the separator 500 according to another embodiment.

According to the current embodiment, the first vacuum suction portions 331 for vacuum-sucking an edge of the top surface of the upper substrate 13 may move in the Y-axis direction to form a gap 19 between surfaces of the upper substrate 13 and the lower substrate in the negative Z-axis direction. The knife 510 may move in the negative Z-axis direction from the side surfaces of the upper substrate 13 and the lower substrate 11 to be inserted into the gap 19 and may successively move in the negative Z-axis direction to cut a coupler (not shown) that couples the upper substrate 13 and the lower substrate 11. That is, according to the current embodiment, a direction in which the knife 510 is initially inserted between the upper substrate 13 and the lower substrate 11 is different from the direction described above with reference to FIGS. 17 and 18. That is, the current embodiment differs from the embodiment of FIGS. 17 and 18 in that the direction in which the knife 510 is initially inserted between the upper substrate 13 and the lower substrate 11 is the same as the direction in which the knife 510 partially separates the upper substrate 13 and the lower substrate 11. In other words, in FIGS. 17 and 18, the knife 510 is inserted at a front of the upper substrate 13 and lower substrate 11 (the front facing the direction lower holding unit 110 moves) and in FIG. 18, the knife 510 is inserted into a side of the upper substrate 13 and lower substrate 11. According to the current embodiment, the knife 510 can be inserted more easily between the two substrates 11 and 13. In addition, it is possible to successively perform an operation of inserting the knife 510 between the upper substrate 11 and the lower substrate 13 and an operation of separating the upper substrate 11 and the lower substrate 13 using the knife 510.

Figure 20:
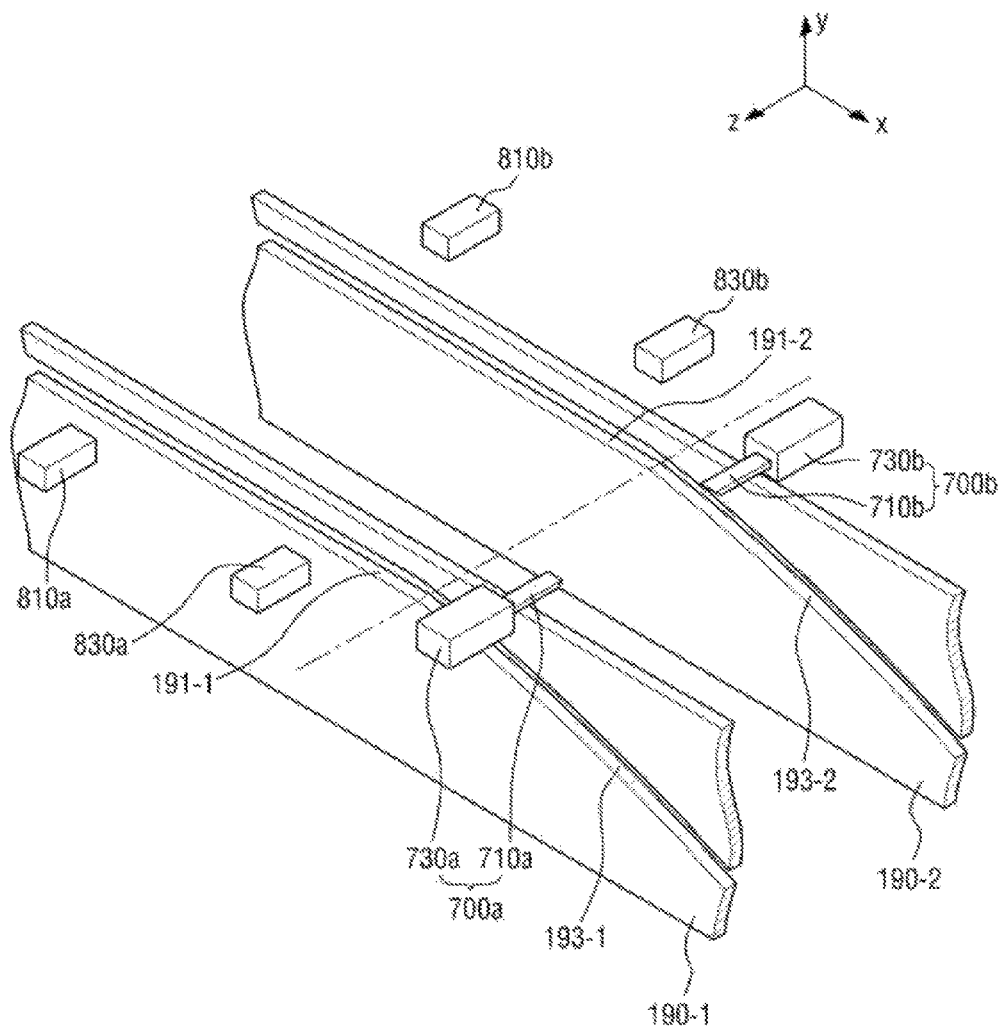
FIG. 20 is a schematic perspective view illustrating the disposition of auxiliary separators and ion generators according to an embodiment in a substrate separation apparatus according to the present disclosure.

FIG. 20 is a schematic perspective view illustrating the disposition of auxiliary separators 700a and 700b and ion generators 810a, 810b, 830a and 830b according to an embodiment in a substrate separation apparatus according to the present disclosure.

Referring to FIG. 20, during a process or while a stacked structure 10 (see FIG. 1) is being transferred, static electricity may accumulate on the stacked structure 10 placed on the lower holding unit 130 (see FIG. 1) for substrate separation. The static electricity accumulated on the stacked structure 10 may contaminate an exposed surface of the stacked structure 10 because the charged surface attracts fine particles around the stacked structure 10. Therefore, the substrate separation apparatus according to the current embodiment may further include the ion generators 810a and 810b in order to remove static electricity charged on at least one of a lower substrate 11 (see FIG. 1) and a upper substrate 13 (see FIG. 1).

The ion generators 810a and 810 may be photoionizers. The photoionizers are at most only minimally affected by external conditions, such as antistatic distance (for removing static electricity) and wind direction, and utilize air ionization. Therefore, the photoionizers do not produce dust, electromagnetic waves and ozone. Also, due to their high ion generation density, the photoionizers are highly efficient in removing static electricity. When the ion generators 810a and 810b irradiate X-rays to the stacked structure 10 (see FIG. 1) placed on the lower holding unit 110 (see FIG. 1), the X-rays may hit gases or atoms existing in the air to produce positive/negative ions. The positive/negative ions may neutralize static electricity charged on the stacked structure 10, thereby removing the static electricity.

In FIG. 20, the ion generators 810a and 810b are disposed at positions on sides of lower guide units 190-1 and 190-2, which correspond to first path guides 191-1 and 191-2, respectively. However, this is merely an example. That is, the ion generators 801a and 810b can also be placed above a space between the lower guide units 190-1 and 190-2 so that they can supply ions simultaneously to all regions of the stacked structure 10 (see FIG. 1). That is, there is no restriction on the number and positions of the ion generators 810a and 810b.

Ion generators 830a and 830b may also be disposed at positions on the sides of the lower guide units 190-1 and 190-2 which correspond to a boundary between the first path guides 191-1 and 191-2 and the second path guides 193-1 and 193-2. As described above, if static electricity accumulates, a charged surface attracts fine particles. Thus, the surface can be contaminated. Therefore, if static electricity is generated on a lower substrate 11 (see FIG. 1) or an upper substrate 13 (see FIG. 1) in the process of separating the stacked structure 10 (see FIG. 1) into the lower substrate 11 and the upper substrate 13, a top surface of the lower substrate 11 or a bottom surface of the upper substrate 13 may be contaminated by the static electricity.

To address this problem, in the substrate separation apparatus according to the current embodiment, the ion generators 830a and 830b are disposed at the positions on the sides of the lower guide units 190-1 and 190-2 which correspond to the boundary between the first path guides 191-1 and 191-2 and the second path guides 193-1 and 193-2. Therefore, it is possible to remove static electricity generated in the substrate separation process, thereby preventing possible contamination in the substrate separation process. The ion generators 830a and 830b may be photoionizers, and there is no restriction on the number of the ion generators 830a and 830b. In addition, there is no restriction on the positions of the ion generators 830a and 830b.

The substrate separation apparatus according to the current embodiment may further include the auxiliary separators 700a and 700b for further partially separating the upper substrate 13 (see FIG. 1) and the lower substrate 11 (see FIG. 1). The auxiliary separators 700a and 700b may be disposed along the sides of a position where the upper substrate 13 (see FIG. 1) and the lower substrate 11 (see FIG. 1) are separated by suction fixation and transfer, that is, the positions on the sides of the boundary between the first path guides 191-1 and 191-2 and the second path guides 193-1 and 193-2. The auxiliary separators 700a and 700b may respectively include auxiliary knifes 710a and 710b which protrude along a Z-axis direction and auxiliary knife supports 730a and 730b which fix and support the auxiliary knifes 710a and 710b.

In an example, the auxiliary knifes 710a and 710b protruding along the Z-axis direction may be placed at a position at which the upper substrate 13 (see FIG. 1) and the lower substrate 11 (see FIG. 1) moving in a positive X-axis direction are separated from each other. In this case, the auxiliary knifes 710a and 710b may be inserted between the two substrates 11 and 13 (see FIG. 1) as the upper substrate 13 and the lower substrate 11 move. Here, as the upper substrate 13 (see FIG. 1) and the lower substrate 11 (see FIG. 1) move in a positive direction of an X axis, they may be separated in a negative direction of the X axis by the auxiliary knifes 710a and 710b. That is, the auxiliary knifes 710a and 710b may be fixed at a specified position, and the upper substrate 13 (see FIG. 1) and the lower substrate 11 (see FIG. 1) may be separated in a negative X-axis direction by the auxiliary knifes 710a and 710b as they move. However, this is merely an example, and the auxiliary separator 700a and 700b may further include driving units to move the auxiliary knifes 710a and 710b, respectively.

As for the positional relationship between the auxiliary separators 700a and 700b and the ion generators 830a and 830b, the ion generators 830a and 830b are placed ahead of the auxiliary separators 700a and 700b based on the X axis. However, this is merely an example. That is, the auxiliary separators 700a and 700b can also be placed ahead of the ion generators 830a and 830b based on the X axis.

Figure 21:
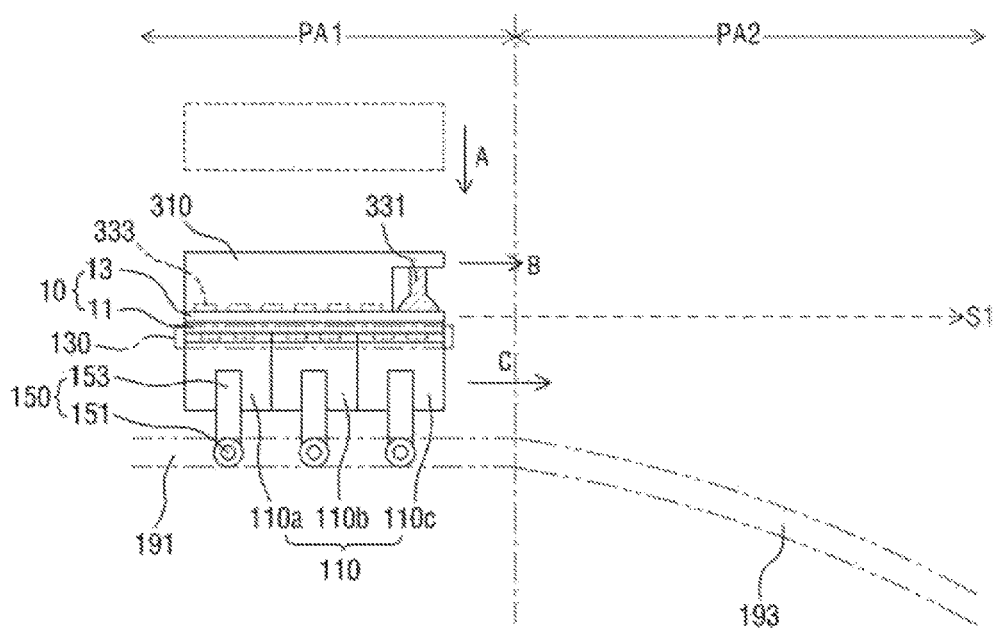
FIGS. 21 through 23 are cross-sectional views respectively illustrating steps of a substrate separation method and the operation of a substrate separation apparatus according to an embodiment.
Figure 22:
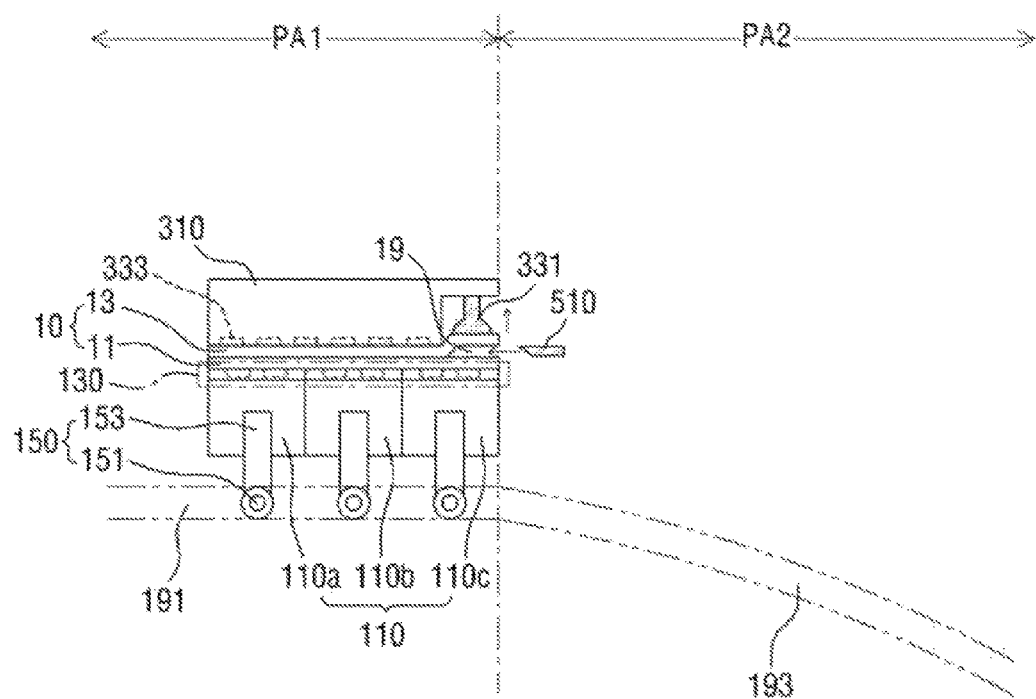
Figure 23:
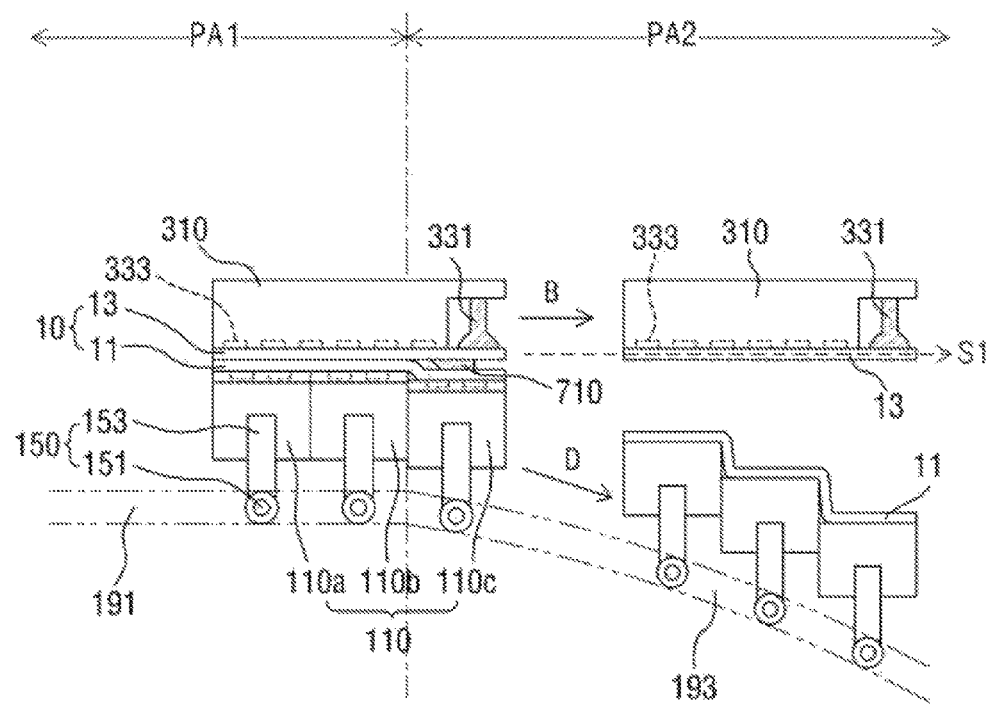
Figure 23:

FIGS. 21 through 23 are cross-sectional views respectively illustrating steps of a substrate separation method and the operation of a substrate separation apparatus according to an embodiment. A case where a lower transfer part 100 is structured as shown in FIGS. 2 and 3 will be described below. However, this is merely an example used for ease of description.

Referring to FIG. 21, a top surface of an upper substrate 13 and a bottom surface of a lower substrate 11 may be fixed. Specifically, a stacked structure 10 is placed on a lower holding unit 110 of the lower transfer part 100, that is, a plurality of auxiliary holding units 110a through 110c which are independent of each other, and the bottom surface of the lower substrate 11 is fixed using a lower fixing unit 130 (130a through 130c). Then, an upper holding unit 310 of an upper transfer part 300 is placed above the stacked structure 10 and then moved in a direction indicated by arrow A, i.e., a negative Y-axis direction, and the top surface of the upper substrate 13 is fixed using an upper fixing unit (331, 333).

Alternatively, although not shown in the drawing, the top surface of the upper substrate 13 may be fixed first. For example, in a state where the stacked structure 10 is fixed by the upper fixing unit (331, 333), the upper holding unit 310 may move to above the lower transfer part 100. Then, the upper holding unit 310 may move in the negative Y-axis direction, i.e., the direction indicated by arrow A to place the stacked structure 10 on the lower holding unit 110, and the lower fixing unit 130 (130*a* through 130*c*) may fix the bottom surface of the lower substrate 11.

The upper substrate 13 having the top surface fixed and the lower substrate 11 having the bottom surface fixed are transferred together in a positive X-axis direction in a first area PA1. More specifically, the upper holding unit 310 may move in the direction indicated by arrow B, i.e., the positive X-axis direction, thereby transferring the upper substrate 13 having the top surface fixed by the upper fixing unit (331, 333). At the same time, the auxiliary holding units 110*a* through 110*c* guided by a first path guide 191 are transferred in a direction indicated by arrow C that parallel to the direction indicated by the arrow B, i.e., the positive X-axis direction.

In other words, the upper substrate 13 having the top surface fixed may be moved along a straight line S1 in the first area PA1, wherein the straight line S1 may be parallel to an X axis.

In addition, the lower substrate 11 having the bottom surface fixed may be transferred together with the lower holding unit 110, and the lower holding unit 110 may be guided by the first path guide 191 whose vertical distance from the straight line S1 is constant.

Referring to FIG. 22, the upper substrate 13 and the lower substrate 11 may be partially separated in the first area PA1 or at a boundary between the first area PA1 and a second area PA2.

Specifically, the upper substrate 13 and the lower substrate 11 are stopped before entering the second area PA2. That is, the movement of the upper holding unit 310 and the movement of the lower holding unit 110 may be stopped. Then, a knife 510 of a separator is moved in a negative X-axis direction to be inserted between the upper substrate 13 and the lower substrate 11 and is moved in a Z-axis direction to partially separate the upper substrate 13 and the lower substrate 11 which are in contact with each other.

Additionally, a process of forming a gap 19 between the upper substrate 13 and the lower substrate 11 by moving first vacuum suction portions 331 of the upper fixing unit (331, 333), which fix an edge of the top surface of the upper substrate 11, in a positive Y-axis direction may further be performed. In this case, the gap 19 makes it easier to insert the knife 510 between the upper substrate 13 and the lower substrate 11 as described above with reference to FIG. 18.

Although not shown in the drawing, the gap 19 may also be formed between side surfaces of the upper substrate 13 and the lower substrate 11 as described above with reference to FIG. 19. In this case, the knife 510 may move in a negative Z-axis direction to be inserted into the gap 19.

Referring to FIG. 23, the upper substrate 13 and the lower substrate 11 are separated as they are moved into the second area PA2.

More specifically, the upper substrate 13 having the top surface fixed by the upper fixing unit (331, 333) is transferred in the positive X-axis direction by moving the upper holding unit 310 in the direction indicated by arrow B, i.e., the positive X-axis direction. At the same time, the auxiliary holding units 110*a* through 110*c* on which the lower substrate 11 is placed and fixed are guided by a second path guide 193 to move in a direction indicated by arrow D, i.e., a direction indicated by the sum of the positive X-axis direction and the negative Y-axis direction.

Steps are formed between the auxiliary holding units 110*a* through 110*c* by the guidance of the second path guide 193, and the lower substrate 11 and the upper substrate 13 may be gradually separated by the steps.

That is, a force that fixes the top surface of the upper substrate 13, a force that moves the upper substrate 13 in the positive X-axis direction, a force that fixes the bottom surface of the lower substrate 11, and a force that moves the auxiliary holding units 110*a* through 110*c*, on which the lower substrate 11 is placed, in the positive X-axis direction and the negative Y-axis direction act as external forces that can gradually separate the upper substrate 13 and the lower substrate 11.

In other words, the upper substrate 13 having the top surface fixed may be transferred along the above straight line S1 in the second area PA2, and the lower substrate 11 having the bottom surface fixed may be transferred under the guidance of the second path guide 193 whose vertical distance from the straight line S1 increases. Accordingly, the upper substrate 13 and the lower substrate 11 may be gradually separated from each other.

An auxiliary separator including an auxiliary knife 710*a* may further be placed on a side of the lower guide unit 190 to further separate the upper substrate 13 and the lower substrate 11 as described above with reference to FIG. 20.

Although not shown in the drawing, ion generators may be placed on sides of the boundary between the first area PA1 and the second area PA2 or between the first path guide 191 and the second path guide 193 at which the separation of the upper substrate 13 and the lower substrate 11 begins. In this case, the ion generators may supply ions to the separated surfaces of the upper substrate 13 and the lower substrate 11, thereby removing static electricity as described above with reference to FIG. 20. Before the separation of the upper substrate 13 and the lower substrate 11, static electricity charged on the stacked structure 10 can also be initially removed by supplying ions using ion generators as described above with reference to FIG. 20.

Embodiments of the present disclosure may provide at least one of the following advantages.

It is possible to separate an upper substrate and a lower substrate more stably by gradually increasing a gap between the upper substrate and the lower substrate. It is also possible to minimize the probability of substrate damage in the separation process.

Furthermore, it is possible to minimize the effect of static electricity by controlling the static electricity in the separation process and prevent contamination due to foreign substances.

However, the effects of the present disclosure are not restricted to those set forth herein. The above and other effects will become more apparent to one of ordinary skill in the relevant art to which the present disclosure pertains, including the appended claims.

While the present disclosure has been particularly shown and described with reference to example embodiments thereof, it will be understood by those of ordinary skill in the art that various changes in form and detail may be made therein without departing from the spirit and scope of the present disclosure, including the following claims. The example embodiments should be considered in a descriptive sense only and not for purposes of limitation.

What is claimed is:

1. An apparatus for separating an upper substrate and a lower substrate which are in contact with each other, the apparatus comprising:
an upper transfer part which is fixed to the upper substrate and transfers the upper substrate in a positive X-axis direction in an XY coordinate system that includes an X axis and a Y axis intersecting each other; and
a lower transfer part which is installed under the upper transfer part with a gap therebetween, the lower transfer part is fixed to and transfers the lower substrate,
wherein the lower transfer part includes:
a lower holding unit on which the lower substrate is placed; and
a lower guide unit which includes path guides for guiding movement of the lower holding unit,
wherein the path guides include a first path guide which is parallel to the X axis and a second path guide which is continuous with the first path guide and is formed along a line having a negative slope in the XY coordinate system.

2. The apparatus of claim 1, wherein an absolute value of the slope of the line is constant.

3. The apparatus of claim 1, wherein the absolute value of the slope of the line increases as a distance along the second path from the first path guide increases.

4. The apparatus of claim 1, further comprising lower connecting units, each having a first side connected to the lower holding unit and a second side contacting the path guides.

5. The apparatus of claim 1, wherein the lower holding unit is comprised of a plurality of auxiliary holding units which are separated from each other.

6. The apparatus of claim 1, wherein the lower transfer part further comprises:
a lower fixing unit which is installed on or in an upper part of the lower holding unit to fix a bottom surface of the lower substrate to the lower holding unit; and
a lower driving unit which moves the lower holding unit.

7. The apparatus of claim 1, wherein the lower fixing unit comprise one or more lower vacuum suction portions which vacuum-suck the bottom surface of the lower substrate.

8. The apparatus of claim 1, further comprising a separator which separates the lower substrate and the upper substrate in a direction of a Z axis intersecting the X axis and the Y axis.

9. The apparatus of claim 8, wherein the separator comprises:
a knife which is inserted between the lower substrate and the upper substrate to separate the upper substrate and the lower substrate;
a knife support which is connected to the knife to fix the knife; and
a knife driving unit which moves the knife support.

10. The apparatus of claim 8, wherein the separator is connected to the upper transfer part.

11. The apparatus of claim 1, further comprising an auxiliary separator which is inserted between the lower substrate and the upper substrate.

12. The apparatus of claim 11, wherein the auxiliary separator is placed on a side of the second path guide or on a side of a boundary between the first path guide and the second path guide.

13. The apparatus of claim 11, wherein the auxiliary separator comprises:
an auxiliary knife which is inserted between the lower substrate and the upper substrate to separate the upper substrate and the lower substrate; and
an auxiliary knife support which is connected to the auxiliary knife to fix the auxiliary knife.

14. The apparatus of claim 1, wherein the upper transfer part comprises:
an upper holding unit; and
an upper fixing unit which is installed under or in a lower part of the upper holding unit to fix a top surface of the upper substrate to the upper holding unit; and
an upper driving unit which moves the upper holding unit.

15. The apparatus of claim 14, wherein the upper fixing unit comprises upper vacuum suction portions which vacuum-suck the top surface of the upper substrate.

16. The apparatus of claim 1, further comprising one or more ion generators which supply ions to an area around the lower substrate or the upper substrate.

17. An apparatus for separating an upper substrate and a lower substrate which are in contact with each other, the apparatus comprising:
an upper transfer part which is fixed to a top surface of the upper substrate and transfers the upper substrate along a straight line; and
a lower transfer part which is installed under the upper transfer part, the lower transfer part is fixed to a bottom surface of the lower substrate, and transfers the lower substrate,
wherein the lower transfer part includes:
a lower holding unit on which the lower substrate is placed; and
a lower guide unit which includes path guides for guiding the movement of the lower holding unit,
wherein the path guides include:
a first path guide whose vertical distance from the straight line is constant; and
a second path guide which is continuous with the first path guide and whose vertical distance from the straight line increases as a distance along the second path guide from the first path guide increases.

18. The apparatus of claim 17, wherein a rate of increase in a vertical distance between the straight line and the second path guide is constant.

19. The apparatus of claim 17, wherein the rate of increase in the vertical distance between the straight line and the second path guide increases as the distance along the second path guide from the first path guide increases.

20. A method of separating an upper substrate and a lower substrate which are in contact with each other, the method comprising:
fixing a bottom surface of the lower substrate to a lower transfer part and a top surface of the upper substrate to an upper transfer part;
transferring the upper substrate along a straight line; and
transferring the lower substrate at the same time as the transferring of the upper substrate,
wherein the transferring of the lower substrate includes:
moving a lower holding unit on which the lower substrate is placed along a first path guide whose vertical distance from the straight line remains unchanged; and
separating the lower substrate and the upper substrate by moving the lower holding unit along a second path guide which is continuous with the first path guide and whose vertical distance from the straight line increases as a distance along the second path guide from the first path guide increases.

* * * * *